(12) United States Patent
Hayashi et al.

(10) Patent No.: US 9,991,614 B2
(45) Date of Patent: Jun. 5, 2018

(54) ANISOTROPIC ELECTRICALLY CONDUCTIVE FILM AND CONNECTION STRUCTURE

(71) Applicant: DEXERIALS CORPORATION, Tokyo (JP)

(72) Inventors: Shinichi Hayashi, Utsunomiya (JP); Masao Saito, Sano (JP); Reiji Tsukao, Utsunomiya (JP); Yasushi Akutsu, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days. days.

(21) Appl. No.: 15/538,525

(22) PCT Filed: Dec. 22, 2015

(86) PCT No.: PCT/JP2015/085744
§ 371 (c)(1),
(2) Date: Jun. 21, 2017

(87) PCT Pub. No.: WO2016/104463
PCT Pub. Date: Jun. 30, 2016

(65) Prior Publication Data
US 2017/0352967 A1    Dec. 7, 2017

(30) Foreign Application Priority Data

Dec. 22, 2014  (JP) ................. 2014-259509

(51) Int. Cl.
*H01R 11/01*   (2006.01)
*H01B 5/14*    (2006.01)
*H01B 1/20*    (2006.01)

(52) U.S. Cl.
CPC .............. *H01R 11/01* (2013.01); *H01B 1/20* (2013.01); *H01B 5/14* (2013.01)

(58) Field of Classification Search
CPC ............. H01R 11/01; H01B 1/20; H01B 5/14
(Continued)

(56) References Cited

U.S. PATENT DOCUMENTS

| | | |
|---|---|---|
| 2010/0018755 A1 | 1/2010 | Tatsuzawa et al. |
| 2015/0208511 A1 | 7/2015 | Ishimatsu |
| 2017/0278820 A1* | 9/2017 | Shinohara ............... H01L 24/29 |

FOREIGN PATENT DOCUMENTS

| | | | | |
|---|---|---|---|---|
| JP | H0660979 B2 * | 8/1994 | .......... | G02F 1/1345 |
| JP | H09-320345 A | 12/1997 | | |

(Continued)

OTHER PUBLICATIONS

Mar. 8, 2016 Search Report issued in International Patent Application No. PCT/JP2015/085744.

(Continued)

*Primary Examiner* — Timothy Thompson
*Assistant Examiner* — Charles Pizzuto
(74) *Attorney, Agent, or Firm* — Oliff PLC

(57) ABSTRACT

An anisotropic electrically conductive film that is suitable for use in fine-pitch FOG connections and COG connections and that also can reduce increases in production costs associated with increasing the electrically conductive particle density. The anisotropic electrically conductive film includes an electrically insulating adhesive layer and electrically conductive particles disposed within the electrically insulating adhesive layer. The anisotropic electrically conductive film has electrically conductive particle disposition regions that are disposed in a manner corresponding to the arrangement of terminals of electronic components to be connected. The electrically conductive particle disposition regions are formed periodically in the longitudinal direction of the anisotropic electrically conductive film. The anisotropic electrically conductive film also has buffer regions in (Continued)

which no electrically conductive particles are disposed that are formed between adjacent electrically conductive particle disposition regions for connection.

14 Claims, 15 Drawing Sheets

(58) Field of Classification Search
USPC .............................................. 174/70 R, 70 A
See application file for complete search history.

(56) References Cited

FOREIGN PATENT DOCUMENTS

| JP | 2007-115560 A | 5/2007 |
|----|---------------|--------|
| JP | 4887700 B2 | 2/2012 |
| WO | 2008-029580 A1 | 3/2008 |
| WO | 2008-143358 A1 | 11/2008 |
| WO | 2014/021424 A1 | 2/2014 |

OTHER PUBLICATIONS

Dec. 13, 2016 Written Opinion issued in International Patent Application No. PCT/JP2015/085744.
Mar. 8, 2016 Written Opinion issued in International Patent Application No. PCT/JP2015/085744.
Apr. 12, 2017 Preliminary Report on Patentability issued in International Patent Application No. PCT/JP2015/085744.

\* cited by examiner

Table 2

| | COMPARATIVE EXAMPLE 2 | EXAMPLE 5 | EXAMPLE 6 | EXAMPLE 7 | EXAMPLE 8 | EXAMPLE 9 |
|---|---|---|---|---|---|---|
| ELECTRICALLY CONDUCTIVE PARTICLE PATTERN IN PARTICLE ARRANGEMENT GROUP | UNIFORMLY ARRANGED | 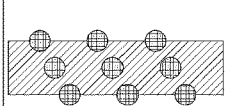 |  | 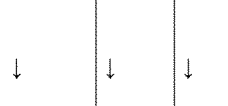 |  |  |
| NUMBER OF ELECTRICALLY CONDUCTIVE PARTICLES IN BUMP FORMATION REGION OF IC CHIP | 58000 | 6500 | 5200 | 10400 | 11700 | 11700 |
| INITIAL CONDUCTION RESISTANCE | 1 Ω OR LESS | ↓ | ↓ | ↓ | ↓ | ↓ |
| CONDUCTION RELIABILITY | 5 Ω OR LESS | ↓ | ↓ | ↓ | ↓ | ↓ |
| SHORT OCCURRENCE RATE | LESS THAN 50 PPM | ↓ | ↓ | ↓ | ↓ | ↓ |

FIG. 15

ANISOTROPIC ELECTRICALLY CONDUCTIVE FILM AND CONNECTION STRUCTURE

TECHNICAL FIELD

The present invention relates to an anisotropic electrically conductive film, a connection method using the anisotropic electrically conductive film, and a connection structure connected via the anisotropic electrically conductive film.

BACKGROUND ART

Anisotropic electrically conductive films are widely used when mounting electronic components such as IC chips on substrates. In recent years, demand has risen for increasingly high wiring density in small electronic devices such as mobile phones and notebook-size personal computers. One well-known technology for achieving this high wiring density involves utilizing an anisotropic electrically conductive film in which electrically conductive particles are uniformly disposed in a lattice form in an electrically insulating adhesive layer of the anisotropic electrically conductive film.

However, even when the electrically conductive particles are uniformly disposed, when the anisotropic electrically conductive film is used to anisotropically electrically conductively connect upper and lower terminals, the electrically conductive particles positioned near the edges of the terminals tend to flow out into space due to melting of the electrically insulating adhesive and do not remain sandwiched between the terminals, which causes problematic variations in connection resistance. One proposed technique for solving this problem involves setting a first arrangement direction of the electrically conductive particles as the longitudinal direction of the anisotropic electrically conductive film and setting a second arrangement direction that intersects with the first arrangement direction to be inclined at an angle of from 5° to 15° relative to a direction orthogonal to the longitudinal direction of the anisotropic electrically conductive film (Patent Document 1).

CITATION LIST

Patent Literature

Patent Document 1: Japanese Patent No. 488770013

SUMMARY OF INVENTION

Problems to be Solved by the Invention

However, as the bump size of electronic components connected via the anisotropic electrically conductive film becomes increasingly small, the number of electrically conductive particles that can be captured by each bump similarly becomes increasingly small. With the anisotropic electrically conductive film disclosed in Patent Document 1, sufficient conduction reliability may not be achieved. In so-called chip-on-glass (COG) connection technologies that are used to connect controller ICs for liquid crystal screens and the like to transparent electrodes formed on glass substrates, bump size can be particularly small due to the increasingly large numbers of terminals associated with increasingly high liquid crystal screen resolutions as well as increasing miniaturization of the IC chips. Similarly, connection terminals also tend to have a relatively fine pitch when using film-on-glass (FOG) bonding technologies to bond flexible printed circuits (FPC) to glass substrates for television displays, which makes it difficult to increase the number of electrically conductive particles that can be captured on each connection terminal.

One conceivable method of increasing the number of electrically conductive particles that can be captured on each connection terminal would be to further increase the density of the electrically conductive particles in the anisotropic electrically conductive film. However, increasing the density of the electrically conductive particle in the anisotropic electrically conductive film increases the production costs of the anisotropic electrically conductive film.

The present invention therefore aims to provide an anisotropic electrically conductive film that is suitable for use in fine-pitch FOG connections and COG connections and that can also reduce increases in production costs associated with increasing the density of the electrically conductive particle.

Solution to Problem

The present inventors discovered the following: (i) when a plurality of electrically conductive particle disposition regions in which the arrangement, arrangement positions, or density of the electrically conductive particles are different are formed as disposition regions in an anisotropic electrically conductive film, the electrically conductive particle disposition regions can be formed corresponding to target objects to be connected using the anisotropic electrically conductive film; in other words, the electrically conductive particle disposition regions can be formed corresponding to the external shapes of terminal arrangement regions of electronic components to be connected using the anisotropic electrically conductive film (for example, when using the anisotropic electrically conductive film in a COG connection, the electrically conductive particles can be disposed in regions corresponding to the periphery of an IC chip where rows of bumps are present, while no electrically conductive particles are disposed in regions corresponding to a center region where no bumps are present), (ii) with such a configuration, the number of electrically conductive particles that do not contribute to making electrical connections can be reduced, thereby, the production costs of the anisotropic electrically conductive film can be reduced, and (iii) when aligning the terminal arrangement regions of electronic components with the electrically conductive particle disposition regions of the anisotropic electrically conductive film, although marks that serves as alignment marks are needed in the anisotropic electrically conductive film, arranging the electrically conductive particles to form such marks removes the need of an additional dedicated step for forming alignment marks to a conventional method of manufacturing anisotropic electrically conductive films. The present inventors thereby arrived at the present invention.

In other words, the present invention provides an anisotropic electrically conductive film, including:
an electrically insulating adhesive layer; and
electrically conductive particles disposed within e electrically insulating adhesive layer,
wherein first electrically conductive particle disposition regions in which a plurality of the electrically conductive particles are disposed and second electrically conductive particle disposition regions in which an arrangement, arrangement positions, or density of the electrically conductive particles are different than that in the first electrically conductive particle disposition regions are formed, and the first electrically conductive particle disposition regions and the second electrically conductive particle disposition regions are formed periodically in a longitudinal direction of the anisotropic electrically conductive film.

The present invention also provides an anisotropic electrically conductive film, including:

an electrically insulating adhesive layer; and
electrically conductive particles disposed within the electrically insulating adhesive layer,
wherein electrically conductive particle disposition regions (hereinafter, also referred to as "electrically conductive particle disposition regions for connection") are formed corresponding to external shapes of terminal arrangement regions of an electronic component to be connected using the anisotropic electrically conductive film, and the electrically conductive particle disposition regions are formed periodically in a longitudinal direction of the anisotropic electrically conductive film.

Furthermore, the present invention also provides a connection structure in which the above-mentioned anisotropic electrically conductive film is used to form an anisotropically electrically conductive connection between a first electronic component and a second electronic component.

Advantageous Effects of Invention

According to the anisotropic electrically conductive film of the present invention, forming the electrically conductive particle disposition regions for connection in a manner corresponding to the external shapes of the terminal arrangement regions can reduce the number of electrically conductive particles that do not contribute to making electrical connections, thereby can reduce the production costs of the anisotropic electrically conductive film.

Particularly, in the anisotropic electrically conductive film of the present invention, forming electrically conductive particle disposition regions that serves as alignment marks (hereinafter, also referred to as "electrically conductive particle disposition regions for positioning") can align the electrically conductive particle disposition regions for connection of the anisotropic electrically conductive film with the terminal arrangement regions of electronic components to be connected, thereby, the terminals can reliably capture electrically conductive particles and reliable conduction can be ensured.

Furthermore, these electrically conductive particle disposition regions that serve as alignment marks can be formed without a need of an additional step to a conventional method of manufacturing anisotropic electrically conductive films.

BRIEF DESCRIPTION OF DRAWINGS

FIG. 15 is a drawing illustrating examples and a comparative example of particle arrangement groups having electrically conductive particle disposition patterns.

DESCRIPTION OF EMBODIMENTS

Figure 1A:
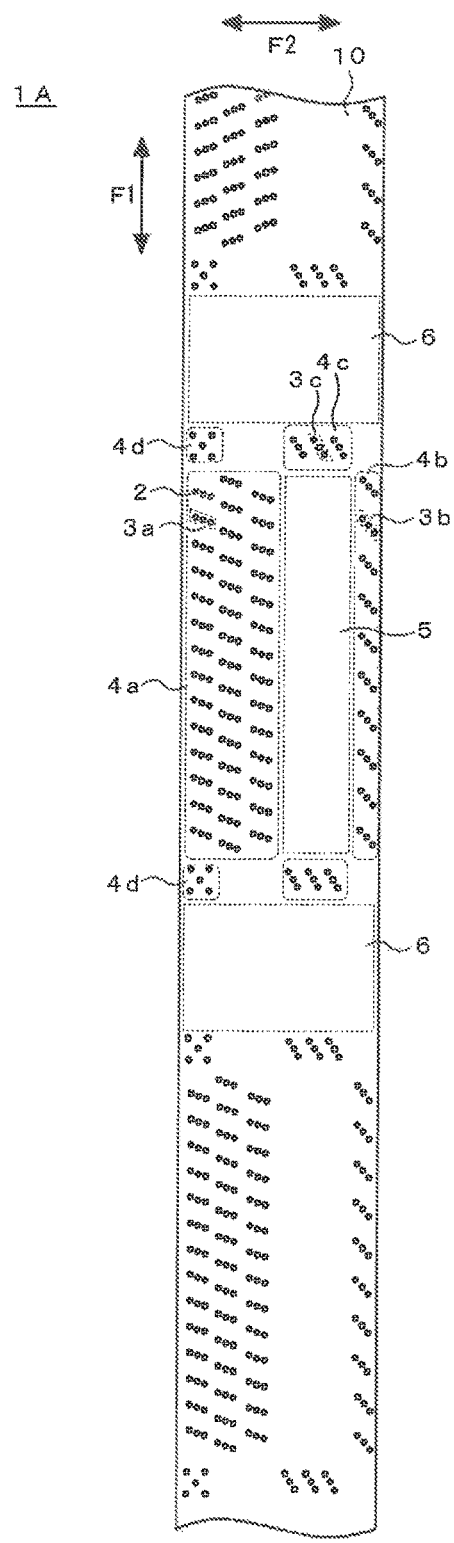
FIG. 1A is a disposition drawing of electrically conductive particles in an anisotropic electrically conductive film 1A.

Next, the present invention will be described in detail with reference to the attached drawings. Note that in the drawings, the same reference characters are used to indicate components that are the same.

Figure 1B:
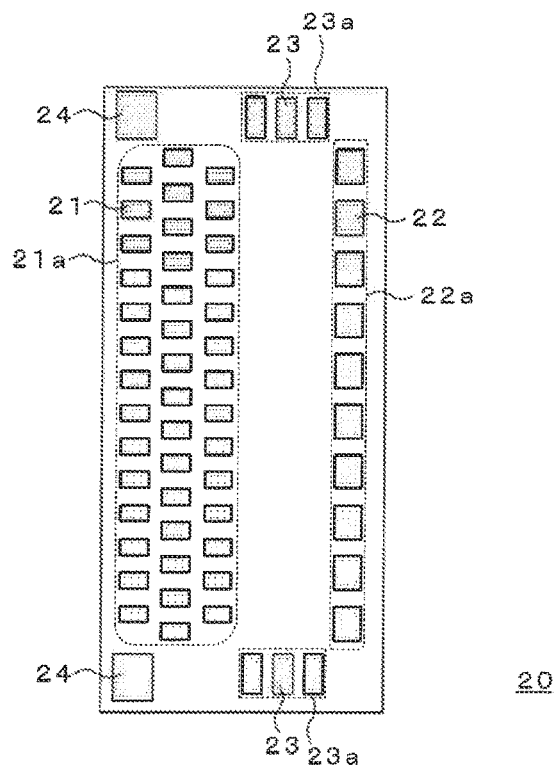
FIG. 1B is a plan view of a terminal surface of an IC chip that is connected using the anisotropic electrically conductive film 1A.
Figure 1C:
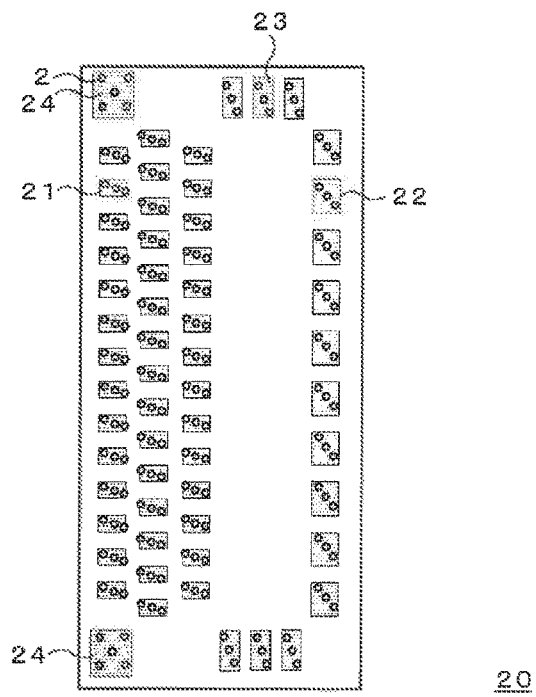
FIG. 1C is a plan view of the electrically conductive particles being captured on terminals of the IC chip by thermo-compressively bonding the anisotropic electrically conductive film 1A to the IC chip.

FIG. 1A is a disposition drawing of electrically conductive particles 2 in an anisotropic electrically conductive film 1A according to one embodiment of the present invention used in a COG connection. FIG. 1B is a plan view of a terminal surface of an IC chip 20 connected using the anisotropic electrically conductive film 1A. FIG. 1C is a plan view of the electrically conductive particles being captured on terminals of the IC chip 20 by thermocompressively bonding the anisotropic electrically conductive film 1A to the IC chip 20.

The anisotropic electrically conductive film 1A includes an electrically insulating adhesive layer 10 and the electrically conductive particles 2 disposed within the electrically insulating adhesive layer 10. As illustrated in FIGS. 1A, 1B, and 1C, the electrically conductive particles 2 of the anisotropic electrically conductive film 1A are disposed in a manner corresponding to the arrangement of the terminals of the IC chip 20.

More specifically, groups of three electrically conductive particles 2 are arranged in lines to form particle arrangement groups 3a at positions corresponding to output bumps 21 of the IC chip 20, and these particle arrangement groups 3a are arranged in a staggered lattice form to form an electrically conductive particle disposition region for connection 4a. The particle arrangement groups 3a are formed so as to be disposed substantially within the respective output bump 21 regions of the IC chip 20 when the anisotropic electrically conductive film 1A and the IC chip 20 are overlaid, and the arrangement of the electrically conductive particles 2 in each particle arrangement group 3a is inclined relative to a longitudinal direction F1 of the anisotropic electrically conductive film 1A in order to improve the particle capturability of the output bumps 21.

Furthermore, the external shape of the electrically conductive particle disposition region for connection 4a corresponds to the external shape of an arrangement region 21a of the output bumps 21. In other words, while the external shapes of the electrically conductive particle disposition region for connection 4a and the arrangement region 21a are substantially the same, the electrically conductive particle disposition region for connection 4a is formed to be slightly larger than the arrangement region 21a of the output bumps 21 so that the electrically conductive particle disposition region for connection 4a covers the arrangement region 21a of the output bumps 21 when the anisotropic electrically conductive film 1A and the IC chip 20 are overlaid. As a result, the electrically conductive particle disposition region for connection 4a and the arrangement region 21a of the output bumps 21 both extend in the longitudinal direction of the anisotropic electrically conductive film 1A.

Similar to the particle arrangement groups 3a formed at positions corresponding to the output bumps 21 as described above, groups of three electrically conductive particles 2 are arranged in lines to form particle arrangement groups 3b and 3c at positions corresponding to input bumps 22 and positions corresponding to side bumps 23, respectively, of the IC chip 20.

Moreover, the particle arrangement groups 3b that correspond to the input bumps 22 are arranged in a row in the longitudinal direction F1 of the anisotropic electrically conductive film 1A to form an electrically conductive particle disposition region for connection 4b. The external shape of the electrically conductive particle disposition region for connection 4b corresponds to the external shape of an arrangement region 22a of the input bumps 22 and is formed such that the electrically conductive particle disposition region for connection 4b covers the arrangement region 22a of the input bumps 22.

Furthermore, the particle arrangement groups 3c that correspond to the side bumps 23 are arranged in a short-side direction F2 of the anisotropic electrically conductive film 1A to form an electrically conductive particle disposition region for connection 4c. The external shape of the electrically conductive particle disposition region for connection 4c corresponds to the external shape of an arrangement region 23a of the side bumps 23 and is formed such that the electrically conductive particle disposition region for connection 4c covers the arrangement region 23a of the side bumps 23.

In this way, the electrically conductive particle disposition regions (second electrically conductive particle disposition regions) 4a, 4b, and 4c in which arrangements or arrangement positions of the electrically conductive particles are different are formed in the anisotropic electrically conductive film 1A, and the external shapes of these electrically conductive particle disposition regions 4a, 4b, and 4c are formed to correspond to the external shapes of the bump arrangement regions 21a, 22a, and 23a of the IC chip 20. As a result, the number of electrically conductive particles that do not contribute to making electrical connections can be reduced, thereby, the production costs of the anisotropic electrically conductive film can be reduced.

Furthermore, in the anisotropic electrically conductive film 1A, the electrically conductive particle disposition regions 4a, 4b, and 4c respectively include the particle arrangement groups 3a, 3b, and 3c that are disposed at positions corresponding to the individual bumps 21, 22, and 23, thereby, the number of electrically conductive particles captured on the bumps 21, 22, and 23 can be reduced to the minimum required to make reliable connections. As a result, the total number of electrically conductive particles required in the anisotropic electrically conductive film 1A can be reduced, thereby, the production costs of the anisotropic electrically conductive film can also be reduced.

Moreover, by reducing the number of electrically conductive particles captured on the bumps 21, 22, and 23 of the IC chip to the minimum required to make reliable connections, the compressive force applied to the IC chip by a pressing tool during connection can be reduced. As a result, the bump density (which is determined by the tolerance of the IC chip to compressive forces during mounting) can be increased, and thereby, the total bump connection area per IC chip can be increased. For example, for a conventional IC chip, the total bump connection area per IC chip is approximately $5\times10^6$ $\mu m^2$. Here, this area can be increased by 1.5 to 3 times. As a result, a more highly integrated IC chip can be achieved.

Meanwhile, electrically conductive particle disposition regions for positioning (first electrically conductive particle disposition regions) 4d are formed, by electrically conductive particles 2 disposed at the four corners and center of a rectangular region, in the anisotropic electrically conductive film 1A at positions corresponding to alignment marks 24 on the IC chip 20. The electrically conductive particle disposition regions for positioning 4d corresponding to the alignment marks 24 are formed separately from the electrically conductive particle disposition regions for connection 4a, 4b, and 4c corresponding to the bump arrangement regions 21a, 22a, and 23a of the IC chip 20 and do not contribute to making electrical connections, but can be used for positioning the IC chip 20 on the anisotropic electrically conductive film 1A. Note that a greater number of electrically conductive particles may be dispose within the electrically conductive particle disposition regions for positioning 4d to set the electrically conductive particle density of the regions 4d to be greater than that of the electrically conductive particle disposition regions for connection 4a, 4b, and 4c.

Conventionally, the alignment marks 24 of the IC chip 20 are formed to be several ten μm to several hundred μm in size and a CCD or laser is used to align the IC chip on the substrate, but no marks corresponding to the alignment marks 24 of the IC chip 20 are formed in the anisotropic electrically conductive film. This is because in conventional anisotropic electrically conductive films, the electrically conductive particles are monodispersed or disposed in a lattice form across the entire surface, so there is no need to align the substrate or IC chip to the anisotropic electrically conductive film at a bump size-dependent precision, and the IC chip and the substrate are aligned by shining a laser light or the like (for detecting alignment positions) through the anisotropic electrically conductive film.

However, when the number of the electrically conductive particles 2 that are captured by the bumps 21, 22, and 23 is reduced to the minimum required to make reliable connections as in the anisotropic electrically conductive film 1A of the present embodiment, the bumps need to be aligned to the anisotropic electrically conductive film 1A at a bump size-dependent precision. Accordingly, alignment marks may need to be provided in the anisotropic electrically conductive film 1A.

One conceivable method of forming alignment marks in the anisotropic electrically conductive film 1A would be to dispose marks of a size corresponding to the alignment marks 24 of the IC chip 20 within the electrically insulating adhesive layer, but such a configuration is difficult due to limitations of the methods of manufacturing anisotropic electrically conductive films. Another conceivable method would be to directly mark the electrically insulating adhesive layer using a printing process or the like, but the actual marking process is difficult due to the small size of the alignment marks.

In contrast, using arrangements of electrically conductive particles as the alignment marks removes the need to add an additional step to the method of manufacturing the anisotropic electrically conductive film. Furthermore, the disposition of the electrically conductive particle in the anisotropic electrically conductive film can be aligned with substrate-side electrodes corresponding to the bumps of the IC chip without placing any particular restrictions on the usage of the manufactured anisotropic electrically conductive film in anisotropically electrically conductive connections. Therefore, in the anisotropic electrically conductive film 1A according to the present embodiment of the present invention, the electrically conductive particle disposition regions for positioning 4d are formed as alignment marks. Moreover, in this anisotropic electrically conductive film 1A, the number of the electrically conductive particles 2 that are captured by the bumps 21, 22, and 23 is reduced to the minimum required to make reliable connections, and therefore the transparency of the anisotropic electrically conductive film 1A remains high even when the electrically conductive particles 2 are also used to form alignment marks in the anisotropic electrically conductive film 1A as described above. As a result, the film can be seen through from the substrate side when performing alignment work. Therefore, the degree of freedom in designing the alignment marks for the IC chip side can be increased, thereby, the IC chip-side alignment marks can be formed near the bump formation regions, and alignment precision can be increased.

The size of the electrically conductive particle disposition regions for positioning 4d is not particularly limited. However, to maintain detection precision when using the anisotropic electrically conductive film 1A of the present embodiment in COG applications, it is preferable that this size be from 100 μm² to 1 mm². Moreover, to maintain detection precision when using the anisotropic electrically conductive film in FOG and FOB applications, it is preferable that this size be from 0.01 mm² to 9 mm².

Meanwhile, a center region 5 in which no electrically conductive particles are disposed is formed in the anisotropic electrically conductive film 1A between the electrically conductive particle disposition region 4a corresponding to the arrangement region 21a of the output bumps 21 of the IC chip 20 and the electrically conductive particle disposition region 4b corresponding to the arrangement region 22a of the input bumps 22. Moreover, a plurality of the electrically conductive particle disposition regions 4a, 4b, and 4c described above corresponding to the bump arrangement regions 21a, 22a, and 23a of the IC chip 20 are formed periodically in the longitudinal direction F1 of the anisotropic electrically conductive film 1A, and buffer regions 6 in which no electrically conductive particles are disposed are formed between neighboring electrically conductive particle disposition regions 4c that are adjacent to one another in the longitudinal direction F1 of the anisotropic electrically conductive film 1A.

Typically, the anisotropic electrically conductive film 1A is wound into a roll for storage and is drawn out prior to use. When using the anisotropic electrically conductive film 1A, the wound anisotropic electrically conductive film 1A is drawn out, and the buffer regions 6 are used as regions in which cuts are made.

The length of the buffer regions 6 in the longitudinal direction F1 of the anisotropic electrically conductive film 1A is not particularly limited. However, from the perspective of improving workability when drawing out and cutting the anisotropic electrically conductive film 1A, for example, it is preferable that this length be greater than or equal to 0.1 mm and more preferable that this length be greater than or equal to 0.2 mm. Meanwhile, from the perspective of maximizing the number of regions per roll of the anisotropic electrically conductive film 1A that can actually be used for making electrical connections, it is preferable that this length be less than or equal to 10 mm, more preferable that this length be less than or equal to 3 mm, and even more preferable that this length be less than or equal to 1 mm.

As described above, according to this anisotropic electrically conductive film 1A, the electrically conductive particle disposition regions 4a, 4b, and 4c are formed at positions corresponding to the bump arrangement regions 21a, 22a, and 23a of the IC chip 20. As a result, the density of the electrically conductive particles 2 can be appropriately adjusted in the electrically conductive particle disposition regions 4a, 4b, and 4c in order to increase the capturability of the electrically conductive particles 2 by the bumps. Moreover, no electrically conductive particles are present in the center region 5 and the buffer regions 6 that correspond to regions where no bumps are present, thereby, the amount of electrically conductive particles that do not contribute to making electrical connections can be reduced. Furthermore, the particle arrangement groups 3a, 3b, and 3c in which the electrically conductive particles 2 are arranged at positions corresponding to the individual bumps are formed in the electrically conductive particle disposition regions 4a, 4b, and 4c, thereby, the capturability of the electrically conductive particles by the bumps 21, 22, and 23 is improved, reducing the occurrence of short-circuits between adjacent bumps.

Figure 2:
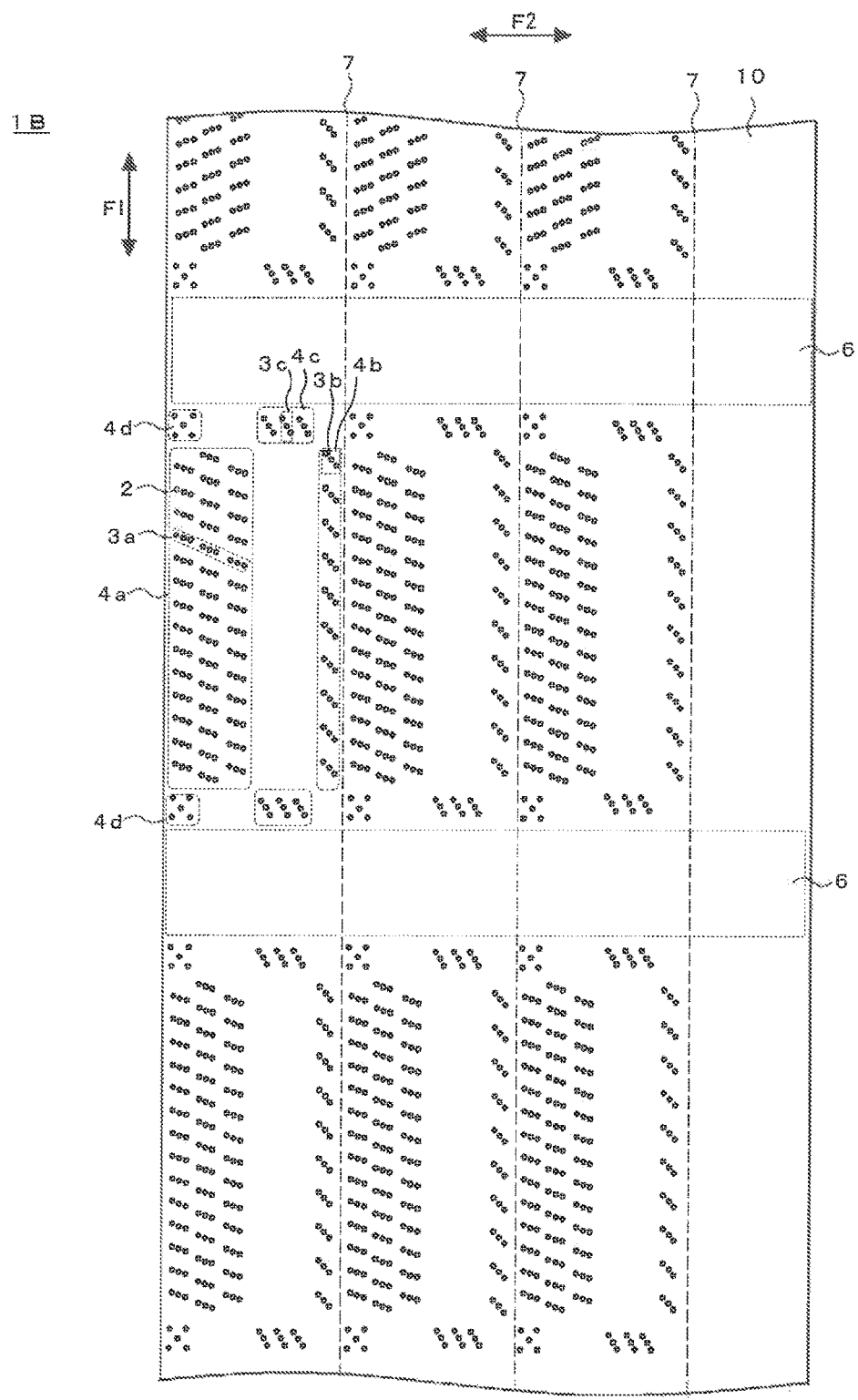
FIG. 2 is a disposition drawing of electrically conductive particles in an anisotropic electrically conductive film 1B.

The anisotropic electrically conductive film of the present invention may take various forms. For example, in the anisotropic electrically conductive film 1B illustrated in FIG. 2, similar to the anisotropic electrically conductive film 1A described above, a plurality of the electrically conductive particle disposition regions for connection 4a, 4b, and 4c may be formed periodically in the longitudinal direction F1 at positions corresponding to the bump arrangement regions of the IC chip 20, and a plurality of columns of this repeating pattern of the electrically conductive particle disposition regions for connection 4a, 4b, and 4c may be formed in the short-side direction F2 of the anisotropic electrically conductive film 1B. This anisotropic electrically conductive film 1B is slit along slit lines 7 and used.

Figure 3:
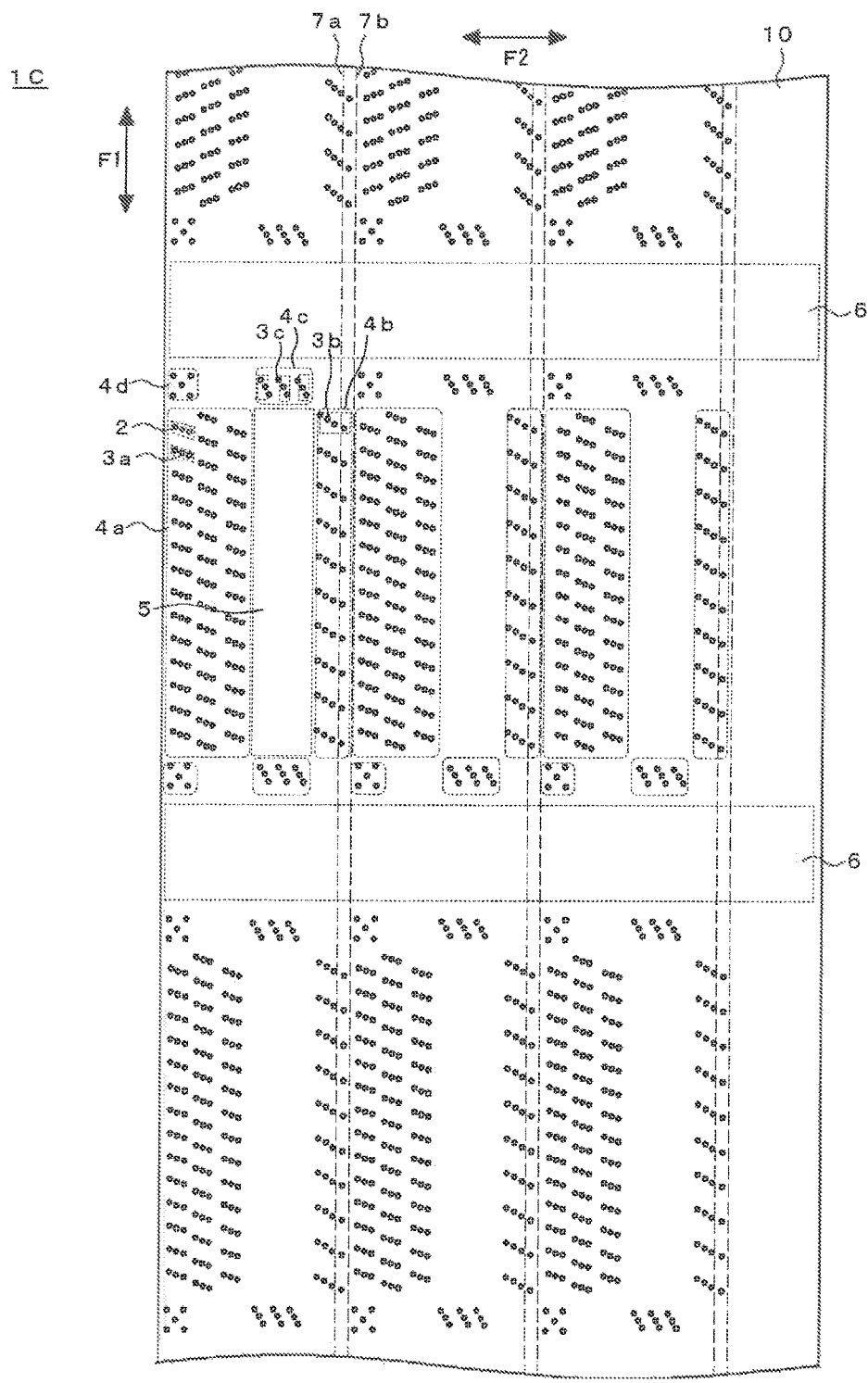
FIG. 3 is a disposition drawing of electrically conductive particles in an anisotropic electrically conductive film 1C.

Moreover, as in the anisotropic electrically conductive film 1C illustrated in FIG. 3, the particle arrangement groups 3h corresponding to the input humps 22 may be extended in the short-side direction F2 of the anisotropic electrically conductive film 1C such that the anisotropic electrically conductive film 1C is either slit along slit lines 7a or along slit lines 7b that are positioned further outwards by an amount corresponding the extended column of the electrically conductive particles. As a result, the anisotropic electrically conductive film remains usable after being slit even if the position at which the anisotropic electrically conductive film is actually slit during the slitting process is shifted.

Figure 4:
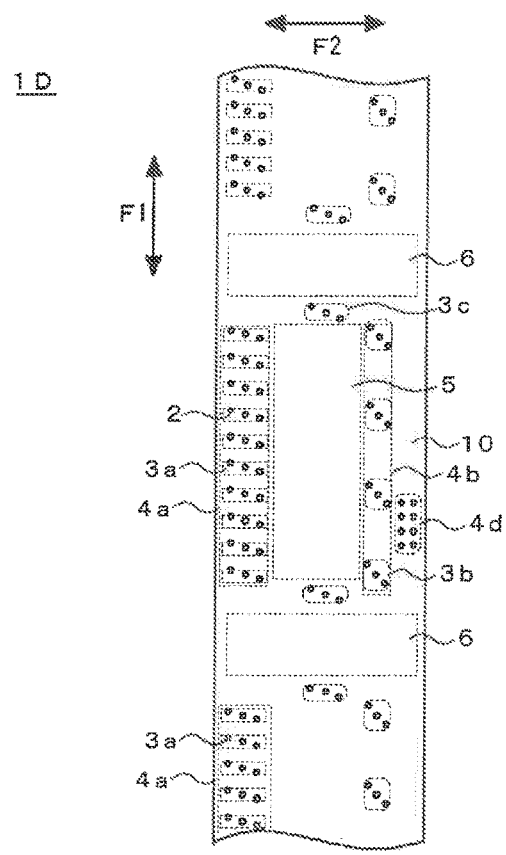
FIG. 4 is a disposition drawing of electrically conductive particles in an anisotropic electrically conductive film 1D.

Furthermore, as in the anisotropic electrically conductive film 1D illustrated in FIG. 4, the electrically conductive particle disposition regions for positioning 4d that are used as alignment marks may be formed at positions along the edge of the anisotropic electrically conductive film 1D in the longitudinal direction F1. In this way, the formation disposition for the electrically conductive particle disposition regions for positioning 4d that are used as alignment marks may be modified as appropriate according to the alignment marks formed on the IC chip.

In the present invention, the disposition of the electrically conductive particles within the electrically conductive particle disposition regions is not particularly limited. As in the anisotropic electrically conductive films 1A to 1D described above, the electrically conductive particles 2 may form the particle arrangement groups 3a, 3b, and 3c and these particle arrangement groups 3a, 3b, and 3c may then be arranged to form the electrically conductive particle disposition regions 4a, 4b, and 4c. Alternatively, the electrically conductive particles may be grouped randomly to form particle groups and the particle groups may be arranged within the electrically conductive particle disposition regions, or individual electrically conductive particle may be arranged in a lattice form within the electrically conductive particle disposition regions, or the electrically conductive particles may be disposed randomly within the electrically conductive particle disposition regions. From the perspective of being able to accurately align components, it is preferable that the electrically conductive particles be disposed within the electrically conductive particle disposition regions to form groups of electrically conductive particles to a point that the outlines of the electrically conductive particle disposition regions can be confirmed.

When using the electrically conductive particles to form the particle arrangement groups within the electrically conductive particle disposition regions, the gaps between adjacent electrically conductive particles in the particle arrangement groups may be set to less than ¼ of the particle diameter of the electrically conductive particles, or the electrically conductive particles may contact one another. Meanwhile, it is preferable that the gaps between adjacent particle arrangement groups be at least 0.5 times the particle diameter of the electrically conductive particles. Here, the "particle diameter of the electrically conductive particles" refers to the average diameter of the electrically conductive particles that form the anisotropic electrically conductive film 1A. From the perspective of preventing short-circuits and ensuring the stability of the connections between connected terminals, it is preferable that the average diameter of the electrically conductive particles be 1 to 30 µm and more preferable that this average diameter be 1 to 10 µm.

Figure 5A:
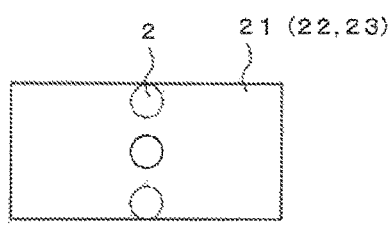
FIG. 5A is a disposition drawing of electrically conductive particles in a particle arrangement group.
Figure 5B:
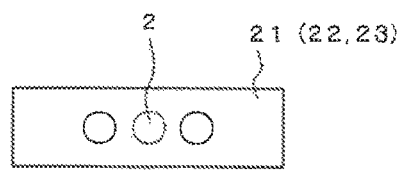
FIG. 5B is a disposition drawing of electrically conductive particles in a particle arrangement group.

The number of electrically conductive particles in each particle arrangement group may be set to two or more, and preferably set to three or more. Moreover, as in the particle arrangement groups 3a, 3b, and 3c in the anisotropic electrically conductive film 1A described above, each particle arrangement group may be arranged in a straight line that is inclined relative to the longitudinal direction of the bump. Alternatively, the electrically conductive particles 2 may be arranged in a straight line dividing the bump 21 (22, 23) widthwise (FIG. 5A), may be arranged in a straight line dividing the bump 21 (22, 23) lengthwise (FIG. 5B), may be arranged in a plurality of straight lines within the bump 21 (22, 23) (FIG. 5C), or may be disposed at the vertices of a triangular shape (FIG. 5D) or at the vertices of a quadrilateral shape or the like (FIG. 5E) within the bump 21 (22, 23). When the external shape of individual particle arrangement group is set to be such a polygonal shape, that polygonal shape may be an equilateral triangle, a square, a rectangle, or the like, or an irregular polygonal shape or a non-symmetric in which one or more vertices thereof protrudes outwards. Bumps typically have a rectangular or circular shape, and therefore having a particle arrangement that is not the same as of similar to these shapes can suppress decreases in the capturability of the electrically conductive particles by the terminals even if the particles shift irregularly when pressure is applied to form anisotropically electrically conductive connections.

Figure 6:
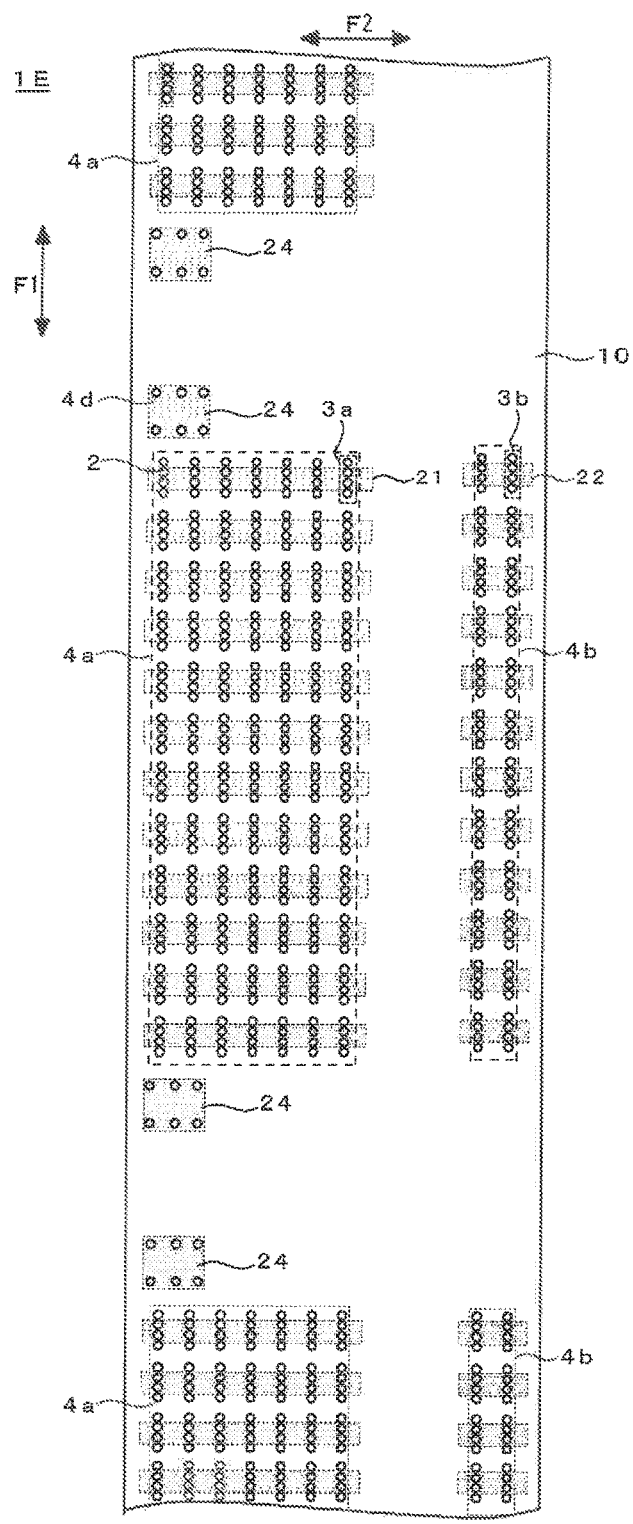
FIG. 6 is a disposition drawing of electrically conductive particles in an anisotropic electrically conductive film 1E.

Furthermore, the electrically conductive particles in the particle arrangement groups may be arranged within regions corresponding to the bumps, or, as in the particle arrangement groups 3a and 3b in the anisotropic electrically conductive film 1E illustrated in FIG. 6, the electrically conductive particles do not necessarily need to be completely contained within the bumps 21 and 22 and may instead be formed spanning across the bumps. Note that in FIG. 6, the regions shaded with dots indicate the alignment marks 24 or the bumps 21 and 22 of the IC chip connected using the anisotropic electrically conductive film 1E.

Figure 7:
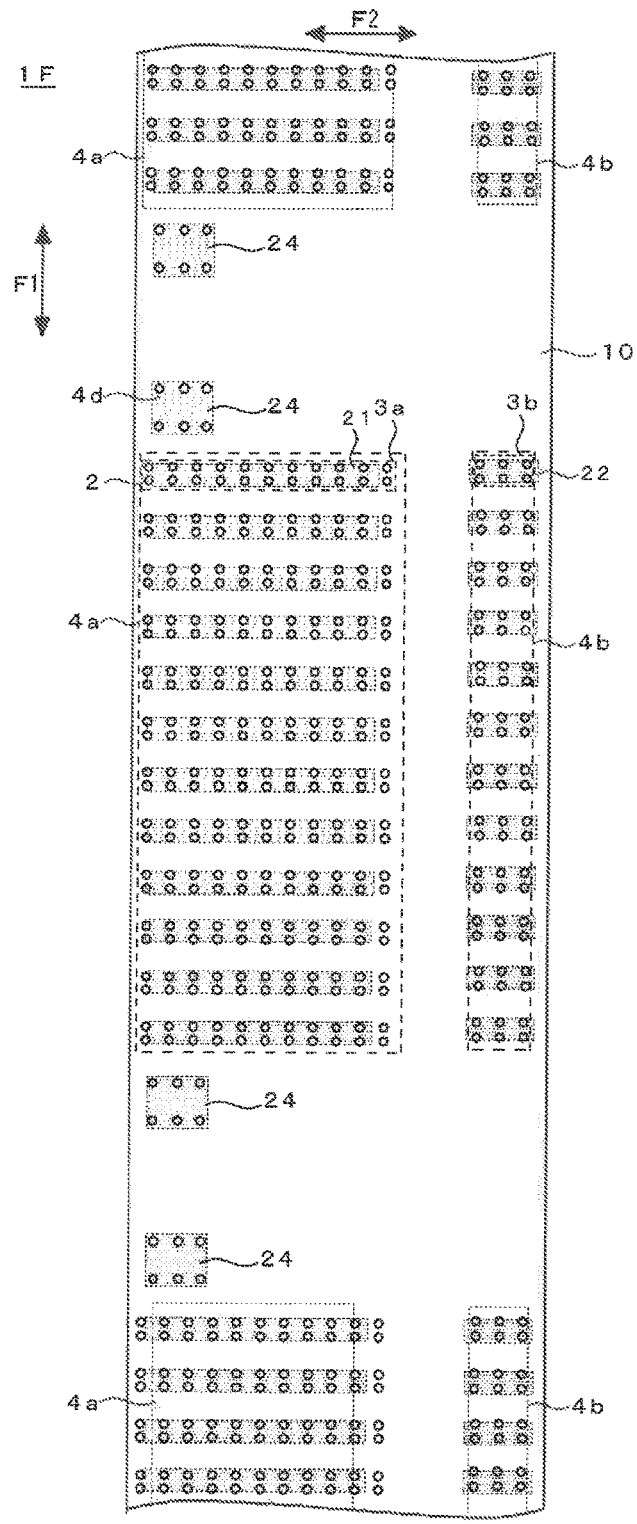
FIG. 7 is a disposition drawing of electrically conductive particles in an anisotropic electrically conductive film 1F.

Moreover, the arrangement direction of the electrically conductive particles in the particle arrangement groups may be the longitudinal direction F1 of the anisotropic electrically conductive film 1F as illustrated in FIG. 6, or may be the short-side direction F2 of the anisotropic electrically conductive film 1F as illustrated in FIG. 7 (that is, the longitudinal direction of the bumps 21 and 22). Furthermore, as illustrated in the particle arrangement groups 3a in the anisotropic electrically conductive film 1F illustrated in FIG. 7, when the length of the bumps is sufficiently greater than the diameter of the electrically conductive particles, more than three of the electrically conductive particles 2 may be arranged in the short-side direction F2 of the anisotropic electrically conductive film (that is, in the longitudinal direction of the bumps 21 and 22). In general, the disposition of the electrically conductive particles within the particle arrangement groups may be determined as appropriate according to the shapes of the bumps themselves or the disposition of the bumps on the IC chip.

In addition, in regards to the arrangement of the particle arrangement groups, when the length of the bumps is sufficiently greater than the diameter of the electrically conductive particles, as illustrated in FIGS. 8A to 8D, the shapes circumscribing the electrically conductive particles 2 of particle arrangement groups 3 may be polygonal shapes having three or more sides, and these particle arrangement groups 3 may be arranged in the longitudinal direction of the bumps 21. These polygonal shapes may be regular polygonal shapes or irregular polygonal shapes.

Figure 8A:
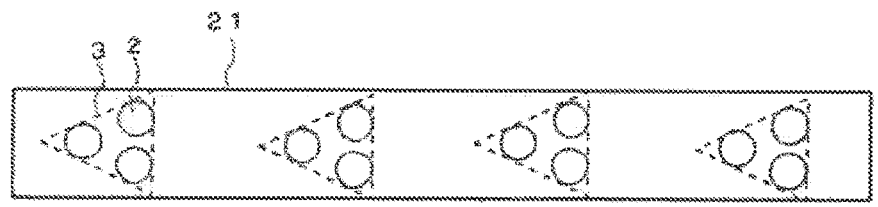
FIG. 8A is a disposition drawing of electrically conductive particles that form particle arrangement groups.
Figure 8B:
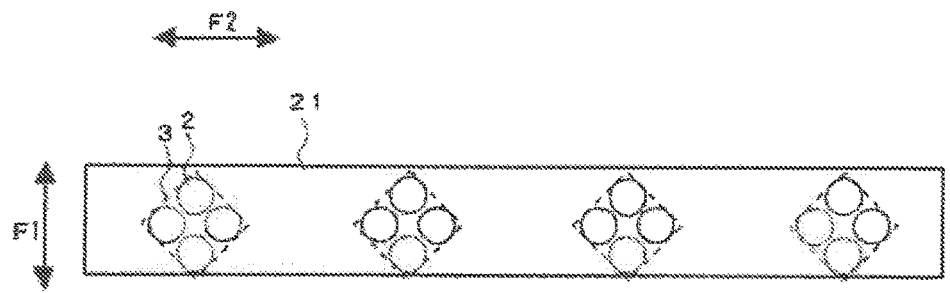
FIG. 8B is a disposition drawing of electrically conductive particles that form particle arrangement groups.

In this case, as illustrated in FIG. 8B, the sides of the polygonal shapes circumscribing the electrically conductive particles 2 in the particle arrangement groups 3 may be oriented so as to intersect with the longitudinal direction F1 or the short-side direction F2 of the anisotropic electrically conductive film. When the bumps 21 have a conventional rectangular shape, setting the orientation of the sides of the polygonal shapes circumscribing the electrically conductive particles 2 in this manner can increase the tolerance of the anisotropic electrically conductive film to shifts in alignment.

Figure 5C:
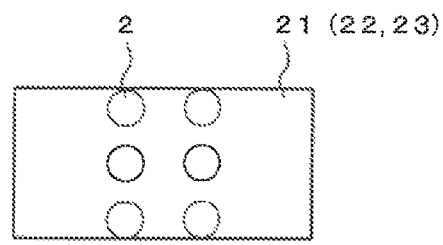
FIG. 5C is a disposition drawing of electrically conductive particles in a particle arrangement group.
Figure 8C:
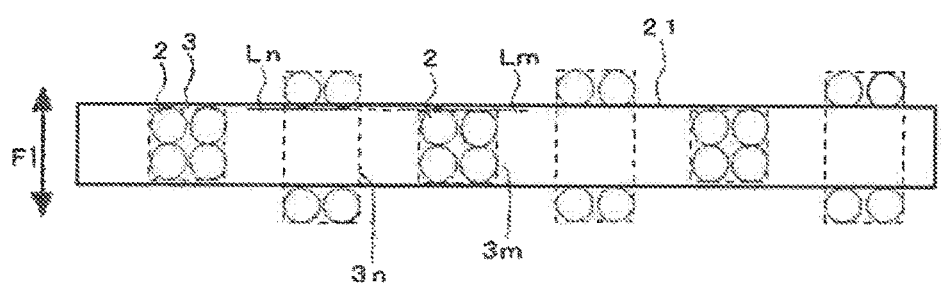
FIG. 8C is a disposition drawing of electrically conductive particles that form particle arrangement groups.

As illustrated in FIG. 8C, the electrically conductive particles may be arranged into electrically conductive particle units (of four electrically conductive particles) 3n each including a pair of particle arrangement groups separate on either side of the bump 21 and also into particle arrangement groups (of four electrically conductive particles) 3m in which the electrically conductive particles are arranged near one another on the bump 21. Then, the electrically conductive particle units 3n, in which the length of the shape circumscribing the particle arrangement group 3 in the short-side direction of the bump 21 (the length in the longitudinal direction F1 of the electrically anisotropic conductive film) is greater than the length of the hump in the short-side direction, may be interspersed with the same number of or fewer particle arrangement groups 3m. As also illustrated in FIG. 5C, a circumscribing line Lm in the longitudinal direction of the bump of the particle arrangement group 3m, which has a rectangular shape in which the length in the short-side direction of the bump is smaller, overlaps with an inscribed line Ln in the longitudinal direction of the bump of the unit 3n, which includes a pair of particle arrangement groups and has a rectangular shape in which the length in the short-side direction of the bump is larger. Therefore, even if positional shifts occur in the longitudinal direction F1 of the anisotropic electrically conductive film when forming anisotropically electrically conductive connections, the bump 21 can still capture a prescribed number of the electrically conductive particles 2.

Figure 5D:
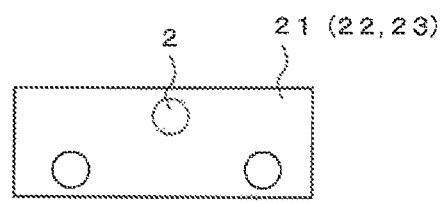
FIG. 5D is a disposition drawing of electrically conductive particles in a particle arrangement group.
Figure 5E:
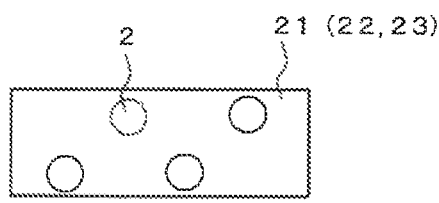
FIG. 5E is a disposition drawing of electrically conductive particles in a particle arrangement group.
Figure 8D:
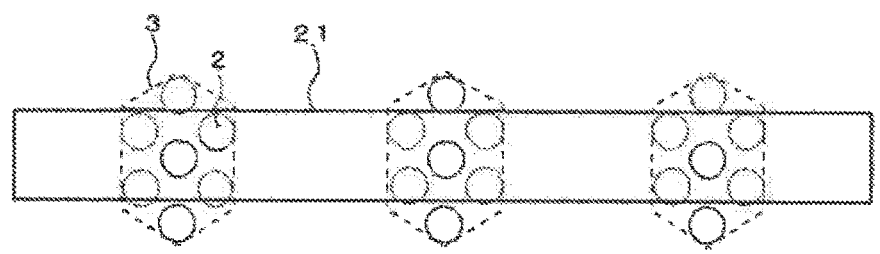
FIG. 8D is a disposition drawing of electrically conductive particles that form particle arrangement groups.

As illustrated in FIG. 5D, the length of the particle arrangement groups 3 in the short-side direction of the bump may be set to be greater than the length of the bump 21 in the short-side direction thereof. As illustrated in FIGS. 8C and 8D, setting the length of the particle arrangement groups 3 in the short-side direction of the bump to be greater than the length of the bump 21 in the short-side direction thereof makes it easier for the bump 21 to capture the electrically conductive particles 2 even when the particle arrangement groups 3 shift from their expected positions relative to the bump 21 due to warping of the film or the like.

Figure 9:
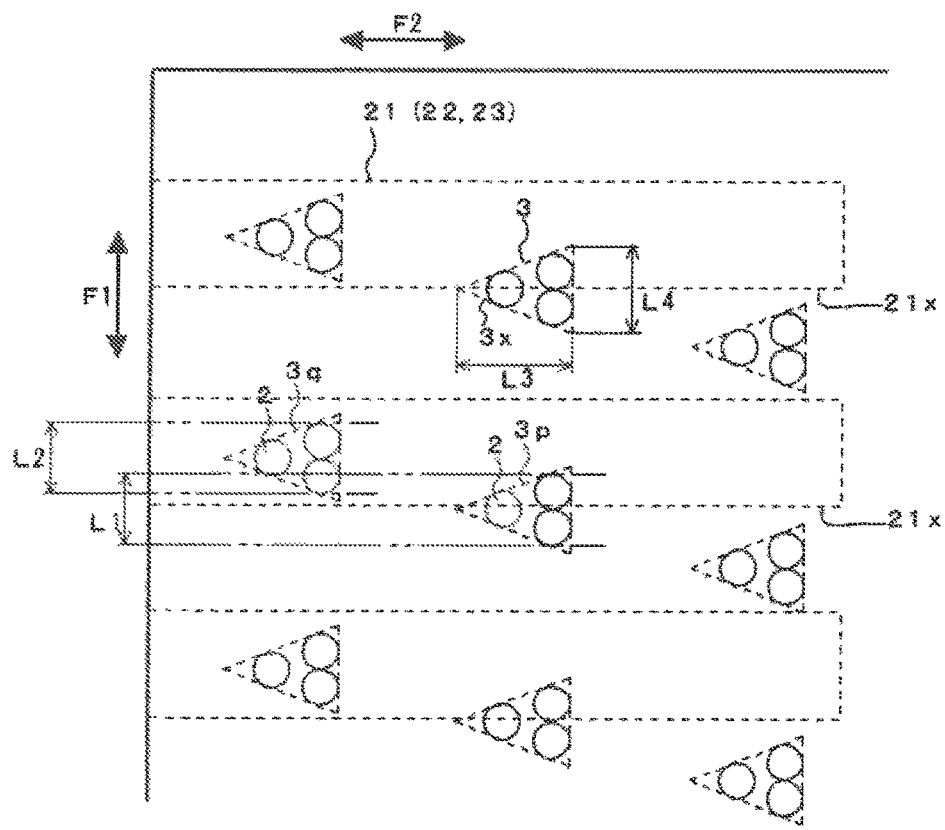
FIG. 9 is a disposition drawing of electrically conductive particles that form particle arrangement groups.

As illustrated in FIG. 9, in order to improve the capturability of the electrically conductive particles 2, it is preferable that a projected width L1 (on a side extending in the longitudinal direction F1 of the anisotropic electrically conductive film) of the electrically conductive particles in particle arrangement groups 3p be overlapped with the corresponding projected width L2 of particle arrangement groups 3g that are adjacent to the particle arrangement groups 3p in the short-side direction F2 of the anisotropic electrically conductive film.

Moreover, as illustrated in FIG. 9, when the shape circumscribing the electrically conductive particles 2 of the particle arrangement groups 3 is a triangular shape, it is preferable that the vertices of these triangular shapes be protruding towards the long sides or short sides of the anisotropic electrically conductive film. The vertices of the triangular shapes protruding towards the long sides of the anisotropic electrically conductive film ensures that when the length L3 of the triangles in the short-side direction F2 of the anisotropic electrically conductive film is greater than the length L4 of the triangles in the longitudinal direction 1 of the anisotropic electrically conductive film, the sides 3x of the triangles will intersect with the edges 21x of the bumps 21 at an acute angle, thereby, particularly improving the capturability of the electrically conductive particles when working with fine-pitch structures.

Figure 10:
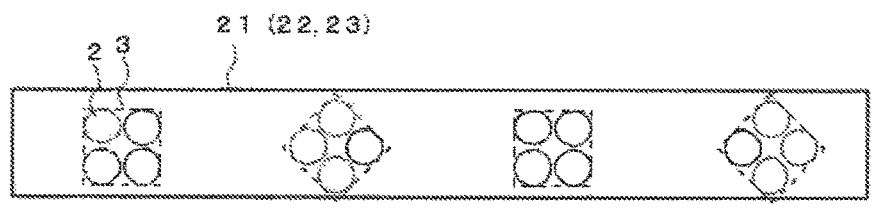
FIG. 10 is a disposition drawing of electrically conductive particles that form particle arrangement groups.

In addition, the arrangements of the electrically conductive particles 2 in the particle arrangement groups 3 may be the same in each of the particle arrangement groups 3 or may be different. When different, the arrangements may be changed in a systematic manner. For example, as illustrated in FIG. 10, the particle arrangement groups 3 may each include the same number of the electrically conductive particles 2 and the shapes circumscribing the electrically conductive particles 2 are the same, but particle arrangement groups in which these shapes circumscribing the electrically conductive particles 2 having different orientations may be interspersed with one another. Alternatively, particle arrangement groups 3 that include different numbers of the electrically conductive particles may be arranged in a regularly repeating manner.

Figure 11:
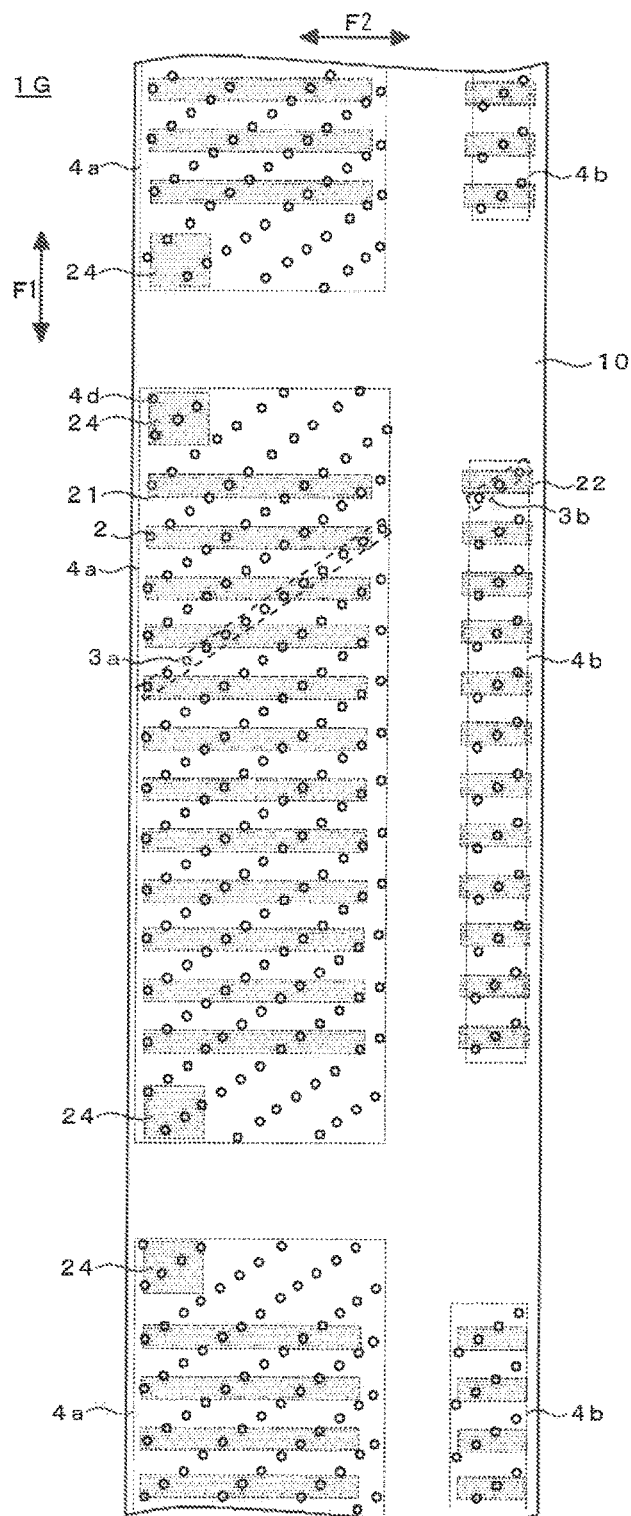
FIG. 11 is a disposition drawing of electrically conductive particles in an anisotropic electrically conductive film 1G.

In the anisotropic electrically conductive film 13 illustrated in FIG. 11, the electrically conductive particles 2 are arranged inclined relative to the longitudinal direction F1 of the anisotropic electrically conductive film to form particle arrangement groups 3a that each span across a plurality of the bumps 21. From the perspective of improving the capturability of the electrically conductive particles by the bumps, it is preferable that the arrangements of the electrically conductive particles in the particle arrangement groups be inclined relative to the longitudinal direction of the anisotropic electrically conductive film 1G.

Moreover, in the anisotropic electrically conductive film 1G illustrated in FIG. 11, the particle arrangement groups 3a are arranged in the longitudinal direction F1 of the anisotropic electrically conductive film to form an electrically conductive particle disposition region 4a that covers the output bump formation region of the IC chip, with the edges of the external shape of the electrically conductive particle disposition region 4a corresponding to the positions of alignment marks 24 on the IC chip. Therefore, in the anisotropic electrically conductive film 1G; no arrangements of electrically conductive particles corresponding specifically to the alignment marks 24 on the IC chip are formed separately from the arrangements of electrically conductive particles corresponding to the bumps of the IC chip.

Figure 12:
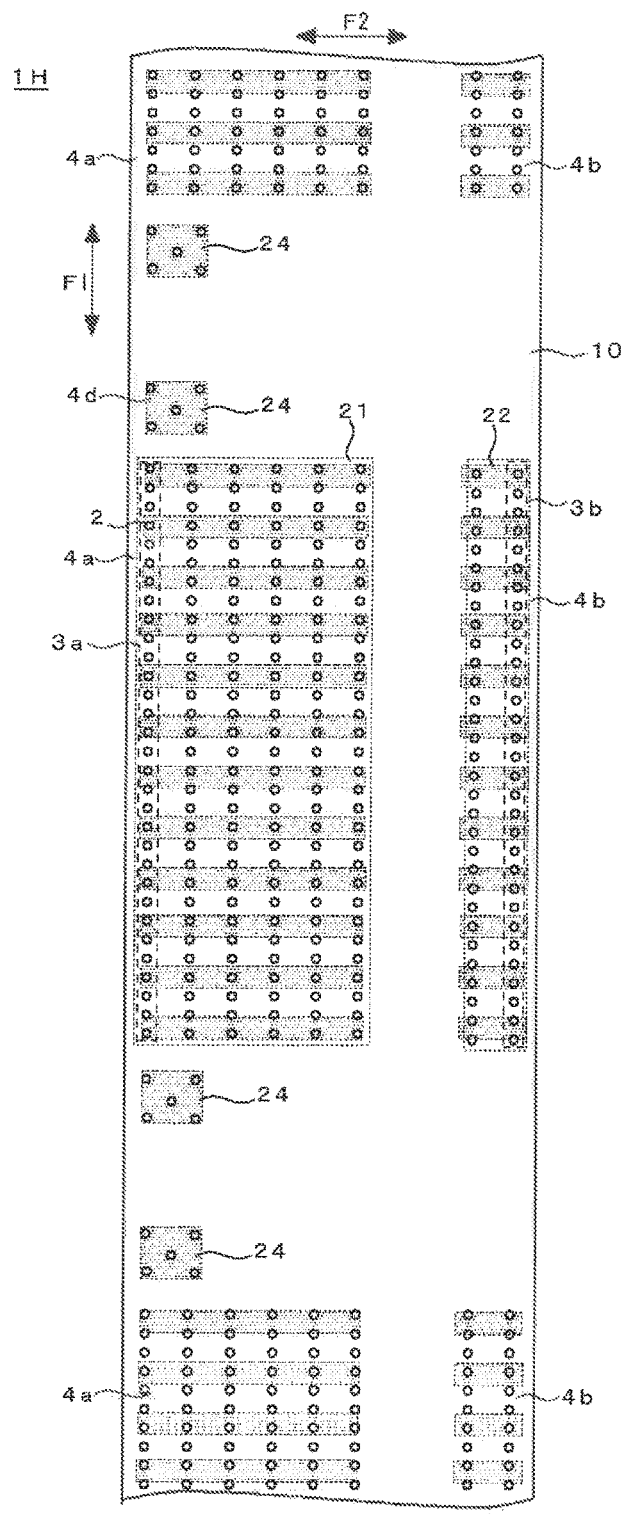
FIG. 12 is a disposition drawing of electrically conductive particles in an anisotropic electrically conductive film 1H.

As in the anisotropic electrically conductive film 1H illustrated in FIG. 12, the electrically conductive particles 2 may be arranged in the longitudinal direction F1 of the anisotropic electrically conductive film 1H to form particle arrangement groups 3a and 3b that span across a plurality of the bumps 21 and 22. These particle arrangement groups 3a and 3b are then arranged in the short-side direction F2 of the anisotropic electrically conductive film 1H to form electrically conductive particle disposition regions 4a and 4b.

In all forms of the anisotropic electrically conductive film, it is preferable that the electrically conductive particles be disposed such that at least three of the electrically conductive particles are captured by each bump, and it is more preferable that at least ten electrically conductive particles be captured by each bump.

Moreover, when each particle arrangement group is formed spanning across the bump with the gaps between adjacent electrically conductive particles in the particle arrangement group being less than ¼ of the particle diameter of the electrically conductive particles, from the perspective of reducing the occurrence of short-circuits after anisotropically electrically conductive connections are formed, it is preferable that the length of the particle arrangement group in the longitudinal direction of the anisotropic electrically conductive film (that is, the length in the short-side direction of the bumps) be less than 0.8 times the distance between adjacent bumps and it is more preferable that this length be less than 0.5 times this distance.

Figure 13:
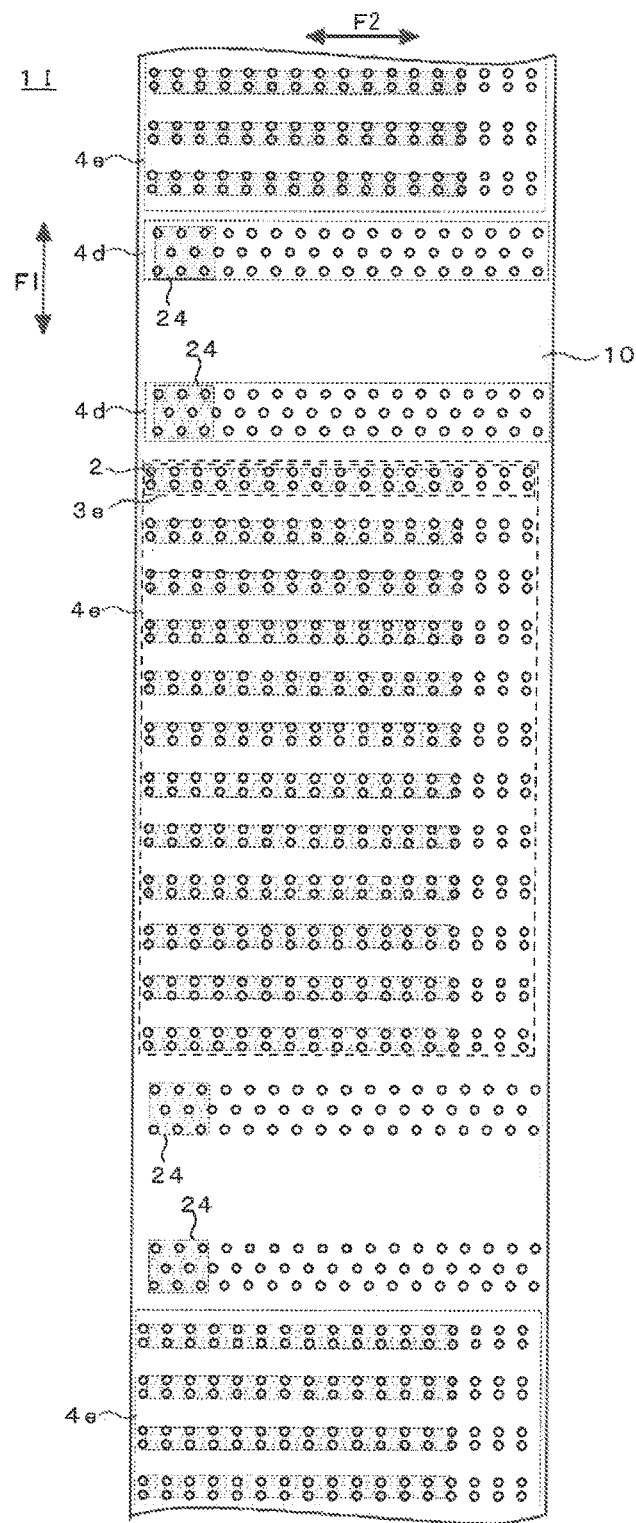
FIG. 13 is a disposition drawing of electrically conductive particles in an anisotropic electrically conductive film 1I.

Meanwhile, when the anisotropic electrically conductive film is used in an FOG connection, first electrically conductive particle disposition regions in which a plurality of electrically conductive particles are disposed and second electrically conductive particle disposition regions in which the arrangement, arrangement positions, or density of the electrically conductive particles are different than in the first electrically conductive particle disposition regions are formed periodically in the longitudinal direction of the anisotropic electrically conductive film. In other words, electrically conductive particle disposition regions for positioning as well as electrically conductive particle disposition regions for connection that correspond to the external shapes of terminal arrangement regions on a substrate are formed periodically in the longitudinal direction F1 of the anisotropic electrically conductive film. For example, as in the anisotropic electrically conductive film 1I illustrated in FIG. 13, the electrically conductive particles 2 are arranged in the short-side direction F2 of the anisotropic electrically conductive film 1I to form particle arrangement groups 3e as particle arrangement groups that correspond to the terminals of the substrate. These particle arrangement groups 3e are arranged in the longitudinal direction F1 of the anisotropic electrically conductive film 1I to form electrically conductive particle disposition regions for connection 4c, and these electrically conductive particle disposition regions for connection 4e are formed periodically in the longitudinal direction F1 of the anisotropic electrically conductive film 1I. The external shape of the electrically conductive particle disposition regions for connection 4e corresponds to the external shape of the terminal arrangement regions on the substrate. Moreover, electrically conductive particle disposition regions for positioning 4d are formed periodically in the longitudinal direction of the anisotropic electrically conductive film 1I as alignment marks on the anisotropic electrically conductive film 1I that correspond to alignment marks 24 on the substrate.

Figure 14:
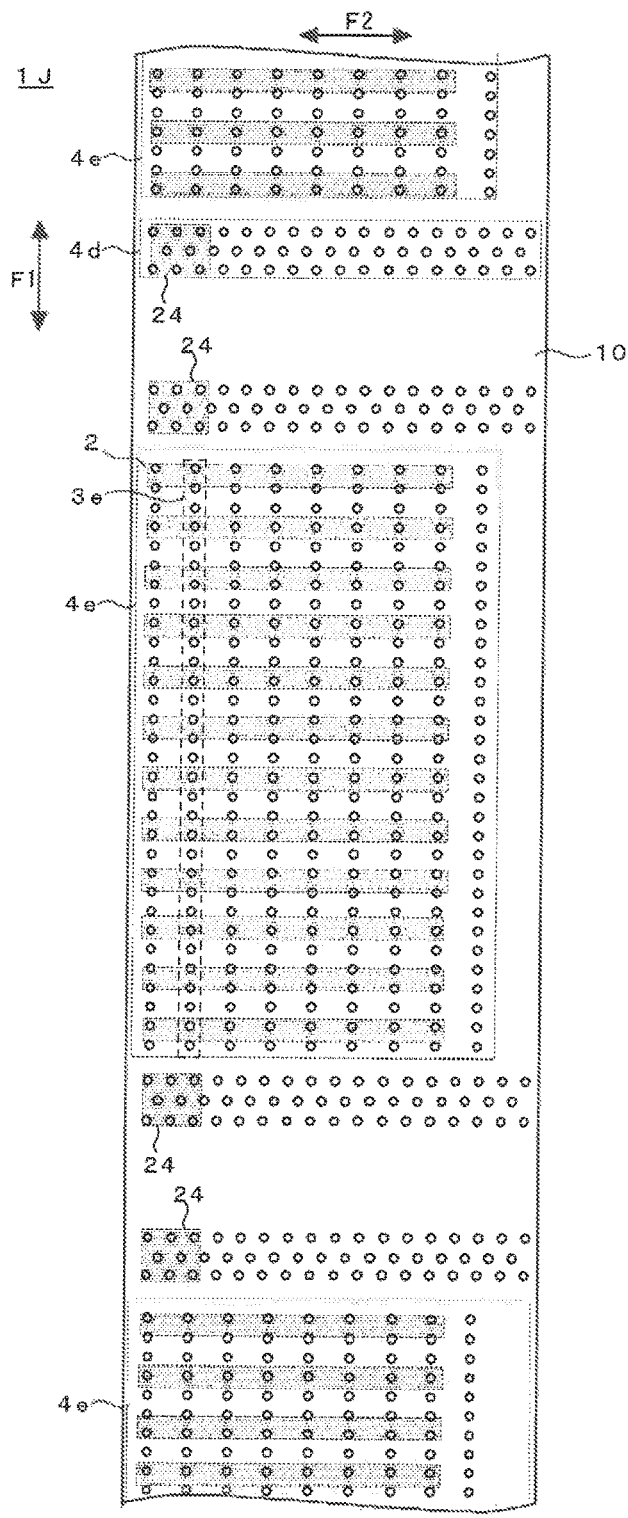
FIG. 14 is a disposition drawing of electrically conductive particles in an anisotropic electrically conductive film 1J.

As in the anisotropic electrically conductive film 1J illustrated in FIG. 14, particle arrangement groups 3e in which the electrically conductive particles 2 are arranged in the longitudinal direction F1 of the anisotropic electrically conductive film 1J may be arranged in the short-side direction F2 of the anisotropic electrically conductive film 1J to form electrically conductive particle disposition regions 4e, and these electrically conductive particle disposition regions 4e may be formed periodically in the longitudinal direction F1 of the anisotropic electrically conductive film 1J. The external shape of the electrically conductive particle disposition regions 4e corresponds to the external shape of terminal arrangement regions on the substrate here as well.

In these anisotropic electrically conductive films 1I and 1J, the electrically conductive particle disposition regions 4d are formed to be aligned with alignment marks 24 formed on a glass substrate or a flexible printed circuit. Alternatively, however, the edges of the electrically conductive particle disposition regions 4e may be formed to overlap with the alignment marks 24 when the anisotropic electrically conductive films 1I or 1J are positioned and overlapped on the glass substrate or flexible printed circuit, and in this case, the electrically conductive particle disposition regions for positioning 4d may be omitted and the edges of the electrically conductive particle disposition regions 4e may be used as the anisotropic electrically conductive film-side alignment marks.

Furthermore, the bump arrangements for some electronic components include dummy bumps that do not contribute to connecting together electronic components but do make it possible to detect the thermocompression bonding conditions from the impressions left when forming anisotropically electrically conductive connections, and some bump arrangements include fine-pitch bumps in combination with relatively large input/output bumps. In these cases, electrically conductive particle disposition regions that correspond to the dummy bumps or the relatively large bumps may be formed in the anisotropic electrically conductive film and used as a substitute for alignment marks.

As described above, the electrically conductive particles that form the particle arrangement groups may be disposed in various ways. When the number of electrically conductive particles captured by each bump is reduced to the minimum required to make reliable connections, it is preferable that the electrically conductive particles be disposed appropriately relative to each bump to account for factors such as movement of the resin in the electrically insulating adhesive layer of the anisotropic electrically conductive film when the anisotropically electrically conductive connections are formed; warping in the film, the substrate, or the IC chip; and the like.

In the present invention, the density of the electrically conductive particles 2 in the electrically conductive particle disposition regions is not particularly limited and may be set as appropriate according to the connection target objects. However, it is preferable that this density be greater than or equal to 10 particles/mm$^2$, more preferable that this density be greater than or equal to 1000 particles/mm$^2$, even more preferable that this density be greater than or equal to 1000 particles/mm$^2$, and particularly preferable that this density be greater than or equal to 2000 particles/mm$^2$. Meanwhile, the upper limit on this density varies according to conditions related to the connection target objects and is not particularly defined. When disposing the electrically conductive particles so as to contact one another within the particle arrangement groups or when disposing the electrically conductive particles in a high density to correspond with alignment marks or dummy bumps or the like, for example, the density of the electrically conductive particles 2 may be set to less than or equal to 250000 particles/mm$^2$. In most cases, it is preferable that the density be less than or equal to 100000 particles/mm$^2$ and more preferable that the density be less than or equal to 50000 particles/mm$^2$. The particle density is adjusted as appropriate according to the particle diameter and arrangement of the electrically conductive particles 2.

In the present invention, the material used for the electrically conductive particles 2 and the layer structure or resin used for the electrically insulating adhesive layer 10 may take various forms.

In other words, any material used in conventional anisotropic electrically conductive films may be appropriately selected and used for the electrically conductive particles 2. Examples thereof include nickel, cobalt, silver, copper, gold, palladium, and similar metal particles, metal-coated resin particles, and the like. A combination of two or more materials may also be used.

Any electrically insulating resin layer used in conventional anisotropic electrically conductive films may be appropriately used as the electrically insulating adhesive layer 10. Examples thereof include a photo-radical polymerization type resin layer containing an acrylate compound and a photo-radical polymerization initiator, a thermal radical polymerization type resin layer containing an acrylate compound and a thermal radical polymerization initiator, a thermal cationic polymerization type resin layer containing an epoxy compound and a thermal cationic polymerization initiator, a thermal anionic polymerization type resin layer containing an epoxy compound and a thermal anionic polymerization initiator, and the like. Polymerized products of these resin layers may be used as necessary. Moreover, the electrically insulating adhesive layer 10 may include a plurality of resin layers.

An electrically insulating filler such as fine silica particles, alumina, or aluminum hydroxide may be added to the electrically insulating adhesive layer 10 as necessary. It is preferable that the compound amount of the electrically insulating filler be from 3 to 40 parts by mass per 100 parts by mass of resin included in the electrically insulating adhesive layer. In this way, even if the electrically insulating adhesive layer 10 melts during formation of anisotropically electrically conductive connections, unnecessary movement of the electrically conductive particles 2 in the melted resin can be prevented.

It is preferable that the minimum molten viscosity of the overall electrically insulating adhesive layer be from 100 to 10000 Pa·s, more preferable that this viscosity be from 500 to 5000 Pa·s, and particularly preferable that this viscosity be from 1000 to 3000 Pa·s. Viscosities within these ranges make it possible to precisely dispose the electrically conductive particles within the electrically insulating adhesive layer 10 and also make it possible to prevent reductions in the capturability of the electrically conductive particles due to movement of the resin when pressure is applied to form anisotropically electrically conductive connections. The minimum molten viscosity can be measured using a rheometer (such as ARES, manufactured by TA Instruments) under the following measurement conditions: a temperature increase rate of 5° C./min, a measurement temperature range of 50 to 200° C., and a vibration frequency of 1 Hz.

An example of a method for fixing the electrically conductive particles 2 within the electrically insulating adhesive layer 10 in one of the dispositions described above may include fabricating a mold having recesses corresponding to the disposition of the electrically conductive particles 2 using a well-known process such as machining, laser processing, or photolithography; placing the electrically conductive particles into the mold; filling the mold with a composition for forming the electrically insulating adhesive layer; curing; and removing the product from the mold. Moreover, this mold may then be used to fabricate a mold made of a material with lower rigidity.

Another example of a method for arranging the electrically conductive particles 2 in the electrically insulating adhesive layer 10 in one of the dispositions described above may include arranging a member in which through holes are formed in a prescribed disposition above the composition for forming the electrically insulating adhesive layer; supplying the electrically conductive particles 2 from thereabove; and passing the electrically conductive particles 2 through the through holes.

When using the anisotropic electrically conductive film of the present invention to form anisotropically electrically conductive connections between connection terminals of a first electronic component such as an FPC, a rigid substrate, a ceramic substrate, a plastic substrate, or a glass substrate and connection terminals of a second electronic component such as an IC chip, an IC module, or an FPC, the two components are aligned in the longitudinal direction F1 of the anisotropic electrically conductive film 1A and in the short-side direction of the connection terminals of the first electronic component or the second electronic component, and then an image detection process or the like using a CCD or the like is used to align alignment marks on the components, and the components are thermocompressively bonded, for example. A photocuring process may also be used when making the connections. Moreover, IC chips or IC modules may be stacked, and then anisotropically electrically conductive connections may be formed between these second electronic components. Connection structures formed in this way are included within the scope of the present invention.

The present invention includes connection structures formed by making anisotropically electrically conductive connections between the first electronic component and the second electronic component as described above.

EXAMPLES

Next, the present invention will be described in detail on the basis of examples.

Examples 1 to 4, Comparative Example 1

(1) Production of Anisotropic Electrically Conductive Film for Use in FOG Connection A mixed electrically insulating resin solution containing 60 parts of a phenoxy resin (a thermoplastic resin) (YP-50, manufactured by Nippon Steel & Sumikin Chemical Co., Ltd.), 40 parts of an epoxy resin (a thermosetting resin) (jER828, manufactured by Mitsubishi Chemical Corporation), and 2 parts of a cationic curing agent (SI-60L, manufactured by Sanshin Chemical Industry Co., Ltd.) was prepared. This mixture was then applied to a PET film with a film thickness of 50 μm and dried for 5 minutes in an 80° C. oven to form an adhesive layer with a thickness of 20 μm on the PET film.

Meanwhile, metal molds (for Examples 1 to 4) having protrusions disposed in a periodic pattern of a prescribed disposition density as well as a metal mold (for Comparative Example 1) having protrusions arranged in a random pattern of a prescribed disposition density were fabricated, with the protrusions being disposed to correspond to the disposition of electrode terminals on a substrate for FOG connection. Then, pellets of a well-known transparent resin were melted, poured into the metal molds, and allowed to cool and harden to form resin molds having recesses arranged in a lattice form. The recesses in these resin molds were filled with electrically conductive particles (AUL704, manufactured by Sekisui Chemical. Co., Ltd.; particle diameter 4 μm) and covered with the electrically insulating resin adhesive layer described above, and then the curable resin in the electrically insulating resin was cured using a UV curing process. Finally, the electrically insulating resin was peeled from the molds, thus completing the anisotropic electrically conductive films of the examples and the comparative example shown in Table 1.

Here, a flexible printed circuit prepared for the FOG connection had an electrode terminal width of 20 μm, a terminal length of 1 mm, a space of 20 μm between terminals, and a terminal density of 25 terminals per 1 $mm^2$ to replicate the bump density of an IC chip.

ITO-coated glass was used for the glass substrate.

Moreover, in Example 1, the electrically conductive particles were disposed such that each electrode terminal (20 μm×1 mm) had 10 electrically conductive particles fitting on that electrode terminal, and the particle arrangement groups were formed periodically so that no electrically conductive particles were present between the electrode terminals.

In Example 2, 14 electrically conductive particles were disposed for each electrode terminal (20 μm×1 mm), and the particle arrangement groups were formed periodically so that no electrically conductive particles were present between the electrode terminals. Here, the electrically conductive particles were disposed so as to protrude out from the electrode terminals in the terminal width direction thereof by an amount equal to the diameter of one electrically conductive particle.

In Example 3, the electrically conductive particles were arranged into particle arrangement groups having a rectangular grid pattern with a distance of 4 μm between particles, two rows in the short-side direction of the terminals, and from 40 to 42 columns in the longitudinal direction of the terminals, and these particle arrangement groups were formed periodically to be positioned on the electrode terminals. Therefore, a total of 2080 electrically conductive particles were disposed in the electrically conductive particle disposition region (1 $mm^2$, including the regions between terminals) corresponding to the 25 electrode terminals.

In Example 4, the particle arrangement groups had substantially the same rectangular grid pattern as in Example 3 but with four rows in the short-side direction of the terminals and from 20 to 24 columns in the longitudinal direction of the terminals, and these particle arrangement groups were formed at positions corresponding to the electrode terminals. Here, the length of the particle arrangement groups in the short-side direction of the terminals was greater than the terminal width (that is, the length of the terminals in the short-side direction thereof). Therefore, a total of 2130 electrically conductive particles were disposed in the electrically conductive particle disposition region (1 $mm^2$, including the regions between terminals) corresponding to the 25 electrode terminals.

In Comparative Example 1, the electrically conductive particles were disposed randomly to achieve an electrically conductive particle density of 5000 particles/$mm^2$.

(2) Conduction Evaluation

Next, the (a) initial conduction resistance, (b) conduction reliability, and (c) short occurrence rate in the anisotropic electrically conductive films of Examples 1 to 4 and Comparative Example 1 were each evaluated as described below. The results are shown in Table 1.

(a) Initial Conduction Resistance

The anisotropic electrically conductive films of Examples 1 to 4 and Comparative Example 1 were sandwiched between flexible printed circuits and glass substrates described above, and the components were thermocompressively bonded (at 180° C. and 5 MPa for 5 seconds) to produce connected object for evaluation. The conduction resistance of each connected object for evaluation was then measured.

Here, the flexible printed circuits, anisotropic electrically conductive films, and glass substrates were manually aligned with one another under a stereo microscope.

(b) Conduction Reliability

The connected object for evaluation from the initial conduction resistance evaluation in (a) were stored in a thermostatic chamber at a temperature of 85° C. and a relative humidity of 85% for 500 hours, and then the conduction resistance of each was measured again in the same manner as in (a). Note that from the perspective of achieving reliable conduction stability between connected electronic components, it is not preferable that this conduction resistance be greater than or equal to 5Ω.

(c) Short Occurrence Rate

ICs of the type described below (a comb tooth-shaped test element group (TEG) with a spacing of 7.5 μm) were prepared as ICs for evaluating the short occurrence rate.

Outer size: 1.5×13 mm

Thickness: 0.5 mm

Bump specifications: Made of gold plating with a height of 15 μm, a size of 25×140 μm, and a distance of 7.5 μm between bumps The anisotropic electrically conductive films of the examples and the comparative example were sandwiched between the ICs for evaluating the short occurrence rate and glass substrates patterned in a manner corresponding to these ICs for evaluation, and these components were thermocompressively bonded under the same connection conditions as in (a) to produce connected objects. The short occurrence rate in each connected object was then evaluated. The short occurrence rate was calculated as the number occurrence of short-circuits divided by the total number of 7.5 μm spaces. From the perspective of producing connection structures suitable for use in practical applications, it is not preferable that the short occurrence rate be greater than or equal to 50 ppm.

TABLE 1

|  | Comparative Example 1 | Example 1 | Example 2 | Example 3 | Example 4 |
| --- | --- | --- | --- | --- | --- |
| High particle density region | Random | Periodic | Periodic | Periodic | Periodic |
| Electrically conductive particle density (particles/$mm^2$) | 5000 | 250 | 350 | 2080 | 2.130 |
| Initial conduction resistance | 2 Ω or less | ← | ← | ← | ← |
| Conduction reliability | 10 Ω or less | ← | ← | ← | ← |
| Short occurrence rate | Less than 50 ppm | ← | ← | ← | ← |

As shown in Table 1, the anisotropic electrically conductive films of Examples 1 to 4 exhibited the same conduction properties as Comparative Example 1 despite the electrically conductive particle densities in the electrically conductive particle disposition regions being less than that in Comparative Example 1, thereby demonstrating that anisotropic electrically conductive films with preferable conduction properties can be manufactured at low cost. Moreover, even when the components in Examples 3 and 4 were bond intentionally shifted by 8 μm and approximately 16 μm, respectively, in the longitudinal direction of the film and then connected in the same manner as described above, substantially the same results were obtained.

In Examples 1 to 4, when 20 parts of a silica filler (fine silica particles, AEROSIL RY 200, manufactured by Nippon Aerosil Co., Ltd.) were further added to 100 parts of the electrically insulating resin and then anisotropic electrically conductive films were manufactured and conduction evaluations were performed in the same manners as described above, satisfactory results were obtained in all cases.

Examples 5 to 9, Comparative Example 2

(1) Production of Anisotropic Electrically Conductive Film for Use in COG Connection Similar to Example 1, using 60 parts of a phenoxy resin (a thermoplastic resin) (YP-50, manufactured by Nippon Steel & Sumikin Chemical Co., Ltd.), 40 parts of an epoxy resin (a thermosetting resin) (jER828, manufactured by Mitsubishi Chemical Corporation), and 2 parts of a cationic curing agent (SI-60L, manufactured by Sanshin Chemical Industry Co., Ltd.), an adhesive layer with a thickness of 20 µm was formed on a PET film.

Meanwhile, metal molds (for Examples 5 to 9) having protrusions disposed in a periodic pattern of a prescribed disposition density as well as a metal mold (for Comparative Example 2) having protrusions arranged in a rectangular grid pattern (with a pitch of 8 µm) were fabricated, with the protrusions being disposed to correspond to the disposition of bumps on an IC chip for COG connection. Then, pellets of a well-known transparent resin were melted, poured into the metal molds, and allowed to cool and harden to form resin molds having recesses arranged in a lattice form. The recesses in these resin molds were filled with electrically conductive particles (AUL704, manufactured by Sekisui Chemical Co., Ltd.; particle diameter 4 µm) and covered with the electrically insulating resin adhesive layer described above, and then the curable resin in the electrically insulating resin was cured using a UV curing process. Finally, the electrically insulating resin was peeled from the molds, thus completing the anisotropic electrically conductive films of the examples and the comparative example shown in table 40, which is illustrated as Table 2 in FIG. 15.

Here, the terminal patterns on IC chips and glass substrates to be COG-connected were formed corresponding to one another and have the dimensions described below.

IC Chips
  Outer size: 0.7×20 mm
  Thickness: 0.2 mm
  Bump specifications: 1300 bumps (650 bumps along each of the two long sides of the IC chip) made of gold plating with a height of 12 µm, a size of 15×100 µm, and a distance of 13 µm between bumps In Examples 5 to 9, particle arrangement groups having the electrically conductive particle disposition patterns illustrated in Table 2 of FIG. 15 were formed only in regions corresponding to the bumps on the IC chips. These particle arrangement groups were arranged in the short-side direction of the bumps to form electrically conductive particle disposition regions constituted by the particle arrangement groups illustrated in Table 2 in regions corresponding to the bump formation regions on the IC chips. In Comparative Example 2, the electrically conductive particles were disposed over the entire bump formation surface of the IC chip in a rectangular grid pattern with a distance of 4 µm between particles. Moreover, in Examples 5 to 9, electrically conductive particle disposition regions having a rectangular grid pattern of 12 particles by 12 particles (144 particles total) and an external shape of 100 µm×100 µm were formed as alignment marks.

Note that the numbers of electrically conductive particles shown in Table 2 of FIG. 15 are the numbers of electrically conductive particles present within the bump formation regions on the IC chips ((14 µm+13 µm)×100 µm×650×2=3.64 mm2).

Glass Substrates
  Glass material: Manufactured by Corning Inc.
  Outer size: 30×50 mm
  Thickness: 0.5 mm
  Electrodes: ITO wires (2) Conduction Evaluation Next, the (a) initial conduction resistance, (b) conduction reliability, and (c) short occurrence rate in the anisotropic electrically conductive films of Examples 5 to 9 and Comparative Example 2 were each evaluated as described below. The results are shown in Table 2 of FIG. 15.

(a) Initial Conduction Resistance

The anisotropic electrically conductive films of Examples 5 to 9 and Comparative Example 2 were sandwiched between the IC chips and corresponding glass substrates described above, and the components were thermocompressively bonded (at 180° C. and 80 MPa for 5 seconds) to produce connected objects for evaluation. The conduction resistance of each connected object for evaluation was then measured.

To align the glass substrates and the anisotropic electrically conductive films, first, marks (100 µm×100 µm in size) corresponding to alignment marks on the IC chips were formed on the glass substrates. Next, while viewing the marks formed on the glass substrates under a stereo microscope, the glass substrates and anisotropic electrically conductive films were manually aligned with one another and temporarily bonded together. This temporary bonding process was performed under the conditions: pressure at 2 MPa, temperature of 60° C., and 1 second. Then, the anisotropic electrically conductive films that were temporarily bonded to the glass substrates were aligned with the IC chips, and the components were thermocompressively bonded together to connect the IC chips. A Flip Chip Bonder FC1000 (manufactured by Toray Engineering Co., Ltd.) was used to connect the IC chips.

(b) Conduction Reliability

The conduction reliability was measured in the same manner as in Example 1. From the perspective of achieving reliable conduction stability between connected electronic components, it is not preferable that this conduction resistance be 5Ω or greater.

(c) Short Occurrence Rate

The short occurrence rate was evaluated in the same manner as in Example 1. From the perspective of producing connection structures suitable for use in practical applications, it is not preferable that the short occurrence rate be greater than or equal to 50 ppm.

As shown in Table 2 of FIG. 15, the anisotropic electrically conductive films of Examples 5 to 9 exhibited the same conduction properties as Comparative Example 2 despite the number of electrically conductive particles in the bump formation regions (including the spaces between bumps) on the IC chips being less than that in Comparative Example 2, thereby demonstrating that anisotropic electrically conductive films with preferable conduction properties can be manufactured at low cost.

Examples 10 to 14

In Examples 5 to 9, 20 parts of a silica filler (fine silica particles. AEROSIL RY 200, manufactured by Nippon Aerosil Co., Ltd.) were further added to 100 parts of the electrically insulating resin, and then anisotropic electrically conductive films were manufactured and conduction evaluations were performed in the same manners as in Examples 5 to 9. Satisfactory results were obtained in all cases.

Examples 15 to 19

In Examples 5 to 9, anisotropic electrically conductive films were manufactured and conduction evaluations were performed in the same manners as in Examples 5 to 9 except in that no alignment marks were formed. Although the alignment work took longer than in Examples 5 to 9, satisfactory conduction results were still obtained.

Examples 20 to 24

In Examples 5 to 9, when evaluating the initial conduction resistance, the electrically conductive particle disposition regions of the anisotropic electrically conductive films and the bump formation regions of the IC chips were shifted slightly when being overlaid, and then the components were thermocompressively bonded to produce connected objects for evaluation. Evaluating the conduction resistance of these connected objects for evaluation revealed the following. In Example 20 (which had the same electrically conductive particle disposition as Example 5), the components could still be successfully connected even when the electrically conductive particle groups were shifted in the width direction of the rectangular bumps by an amount equal to the diameter of one particle.

In Example 21 (which had the same electrically conductive particle disposition as Example 6), the components could still be successfully connected even when the centers of the electrically conductive particle groups were shifted away (in the bump width direction) from the widthwise centers of the bumps by 30% of the bump width (4.5 μm).

In Example 22 (which had the same electrically conductive particle disposition as Example 7), the components could still be successfully connected even when the electrically conductive particle groups were shifted in the bump width direction by an amount equal to the diameter of two electrically conductive particles as long as at least one of the long sides of each rectangular electrically conductive particle group was still positioned within the width of the respective bump.

In Example 23 (which had the same electrically conductive particle disposition as Example 8), the components could still be successfully connected even when the centers of the rectangular electrically conductive particle groups were shifted relative to the widthwise centers of the bumps in the bump width direction by an amount equal to the diameter of three electrically conductive particles.

In Example 24 (which had the same electrically conductive particle disposition as Example 9), the components could still be successfully connected even when the centers of the rectangular electrically conductive particle groups were shifted relative to the widthwise centers of the bumps in the bump width direction by an amount equal to the diameter of three electrically conductive particles. Here, the state of the electrically conductive particles after pressure was applied was even more satisfactory than in Example 8.

Examples 25 to 29

In Example 15, the electrically conductive particles corresponding to each bump were arranged into the particle arrangement groups 3 illustrated in FIGS. 8A to 8D and FIG. 10, and then conduction evaluations were performed in the same manner as in Example 15. Similar to Example 15, the dimensions of the bumps were 15μ×100 μm with a space of 13 μm between bumps. The number of electrically conductive particles captured on each bump was 12 particles for the arrangement illustrated in FIG. 8A, 16 particles for the arrangement illustrated in FIG. 8B, 12 particles for the arrangement illustrated in FIG. 8C, 15 particles for the arrangement illustrated in FIG. 8D, and 16 particles for the arrangement illustrated in FIG. 10. In each case, a satisfactory connection was achieved.

REFERENCE SIGNS LIST 1A, 1B, 1C, 1D, 1E, 1F, 1G, 1H, 1I, 1J Anisotropic electrically conductive film.
2 Electrically conductive particle
3, 3a, 3b, 3c, 3e, 3m, 3p, 3q Particle arrangement group
4a, 4b, 4c, 4e Electrically conductive particle disposition region for connection
4d Electrically conductive particle disposition region for positioning
5 Center region in which no electrically conductive particles are present
6 Buffer region in which no electrically conductive particles are present
7, 7a, 7b Slit line
10 Electrically insulating adhesive layer
20 IC chip
21 Output bump
21a Output bump arrangement region
22 Input bump
22a Input bump arrangement region
23 Side bump
23a Side bump arrangement region
24 Alignment mark
30 Substrate electrode terminal
31 Substrate alignment mark
F1 Longitudinal direction of anisotropic electrically conductive film
F2 Short-side direction of anisotropic electrically conductive film

The invention claimed is:

1. An anisotropic electrically conductive film, comprising:
an electrically insulating adhesive layer; and
electrically conductive particles disposed within the electrically insulating adhesive layer,
wherein electrically conductive particle disposition regions, also referred to as electrically conductive particle disposition regions for connection, are formed corresponding to external shapes of terminal arrangement regions of an electronic component to be connected using the anisotropic electrically conductive film, and
the electrically conductive particle disposition regions are formed periodically in a longitudinal direction of the anisotropic electrically conductive film.

2. The anisotropic electrically conductive film according to claim 1, wherein buffer regions in which none of the electrically conductive particles are disposed are formed between the electrically conductive particle disposition regions for connection adjacent to each other.

3. The anisotropic electrically conductive film according to claim 1, wherein the electrically conductive particle disposition regions, also referred to as the electrically conductive particle disposition regions for positioning, are formed as alignment marks aligning the anisotropic electrically conductive film with terminals for which to form anisotropically electrically conductive connections.

4. The anisotropic electrically conductive film according to claim 1, wherein the electrically conductive particle disposition regions for positioning are formed separately from the electrically conductive particle disposition regions for connection.

5. The anisotropic electrically conductive film according to claim 1, wherein the electrically conductive particle disposition regions for positioning are formed overlapping with the electrically conductive particle disposition regions for connection.

6. The anisotropic electrically conductive film according to claim 1, wherein particle arrangement groups constituted by a plurality of the electrically conductive particles are arranged within the electrically conductive particle disposition regions for connection.

7. The anisotropic electrically conductive film according to claim 1, wherein in the electrically conductive particle disposition regions for connection, at least three of the electrically conductive particles are disposed for each bump of an electronic component to be connected using the anisotropic electrically conductive film.

8. The anisotropic electrically conductive film according to claim 1, wherein a plurality of electrically conductive particle disposition regions for connection are each formed periodically in the longitudinal direction of the anisotropic electrically conductive film.

9. The anisotropic electrically conductive film according to claim 1, wherein the electrically conductive particle disposition regions for connection are formed aligned in the longitudinal direction of the anisotropic electrically conductive film.

10. A connection structure in which the anisotropic electrically conductive film according to claim 1 is used to form an anisotropically electrically conductive connection between a first electronic component and a second electronic component.

11. An anisotropic electrically conductive film, comprising:
    an electrically insulating adhesive layer; and
    electrically conductive particles disposed within the electrically insulating adhesive layer,
    wherein first electrically conductive particle disposition regions in which a plurality of the electrically conductive particles are disposed and second electrically conductive particle disposition regions in which an arrangement, arrangement positions, or density of the electrically conductive particles are different than that in the first electrically conductive particle disposition regions are formed, and
    the first electrically conductive particle disposition regions and the second electrically conductive particle disposition regions are formed periodically in a longitudinal direction of the anisotropic electrically conductive film.

12. The anisotropic electrically conductive film according to claim 11, wherein buffer regions in which none of the electrically conductive particles are disposed are formed between the second electrically conductive particle disposition regions adjacent in the longitudinal direction of the anisotropic electrically conductive film.

13. The anisotropic electrically conductive film according to claim 11, wherein the first electrically conductive particle disposition regions are electrically conductive particle disposition regions for positioning.

14. The anisotropic electrically conductive film according to claim 11, wherein the second electrically conductive particle disposition regions are electrically conductive particle disposition regions for connection.

* * * * *